(12) United States Patent
Song et al.

(10) Patent No.: US 8,433,373 B2
(45) Date of Patent: Apr. 30, 2013

(54) MOBILE TERMINAL WITH MULTIPLE BATTERIES

(75) Inventors: Yoomee Song, Seoul (KR); Seunghoon Lee, Seoul (KR); Yunghee Kim, Seoul (KR); Hyounkeun Kim, Seoul (KR); Changmin Ma, Seoul (KR); Jaedo Kwak, Seoul (KR); Byungkee Chae, Seoul (KR); Youngbak Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 88 days.

(21) Appl. No.: 12/832,875

(22) Filed: Jul. 8, 2010

(65) Prior Publication Data

US 2011/0009172 A1    Jan. 13, 2011

(30) Foreign Application Priority Data

Jul. 8, 2009   (KR) .................. 10-2009-0062135
Aug. 10, 2009  (KR) .................. 10-2009-0073403
Aug. 10, 2009  (KR) .................. 10-2009-0073409

(51) Int. Cl.
*H04M 1/00* (2006.01)

(52) U.S. Cl.
USPC ..... 455/573; 455/572; 455/343.1; 455/343.6; 455/566

(58) Field of Classification Search .................. 455/573, 455/572, 343.1, 343.6, 566
See application file for complete search history.

(56) References Cited

U.S. PATENT DOCUMENTS

| | | | |
|---|---|---|---|
| 5,136,229 A | 8/1992 | Galvin | |
| 7,177,690 B2 * | 2/2007 | Woods et al. | 607/29 |
| 7,494,729 B2 * | 2/2009 | Odaohhara | 429/9 |
| 2009/0051223 A1 * | 2/2009 | Woo | 307/80 |
| 2009/0163247 A1 * | 6/2009 | Song | 455/566 |
| 2010/0160002 A1 * | 6/2010 | Oh | 455/573 |
| 2011/0039605 A1 * | 2/2011 | Choi et al. | 455/573 |

FOREIGN PATENT DOCUMENTS

JP    2000-032100    1/2000

* cited by examiner

*Primary Examiner* — Charles Appiah
*Assistant Examiner* — Khai M Nguyen
(74) *Attorney, Agent, or Firm* — Lee, Hong, Degerman, Kang & Waimey

(57) ABSTRACT

Embodiments of the present invention are related to a mobile terminal, the mobile terminal including: first and second batteries for supplying driving power to parts of the mobile terminal; a display for displaying an operational state of the mobile terminal to a user; and a controller for notifying the user of charged levels of the first and second batteries.

7 Claims, 53 Drawing Sheets

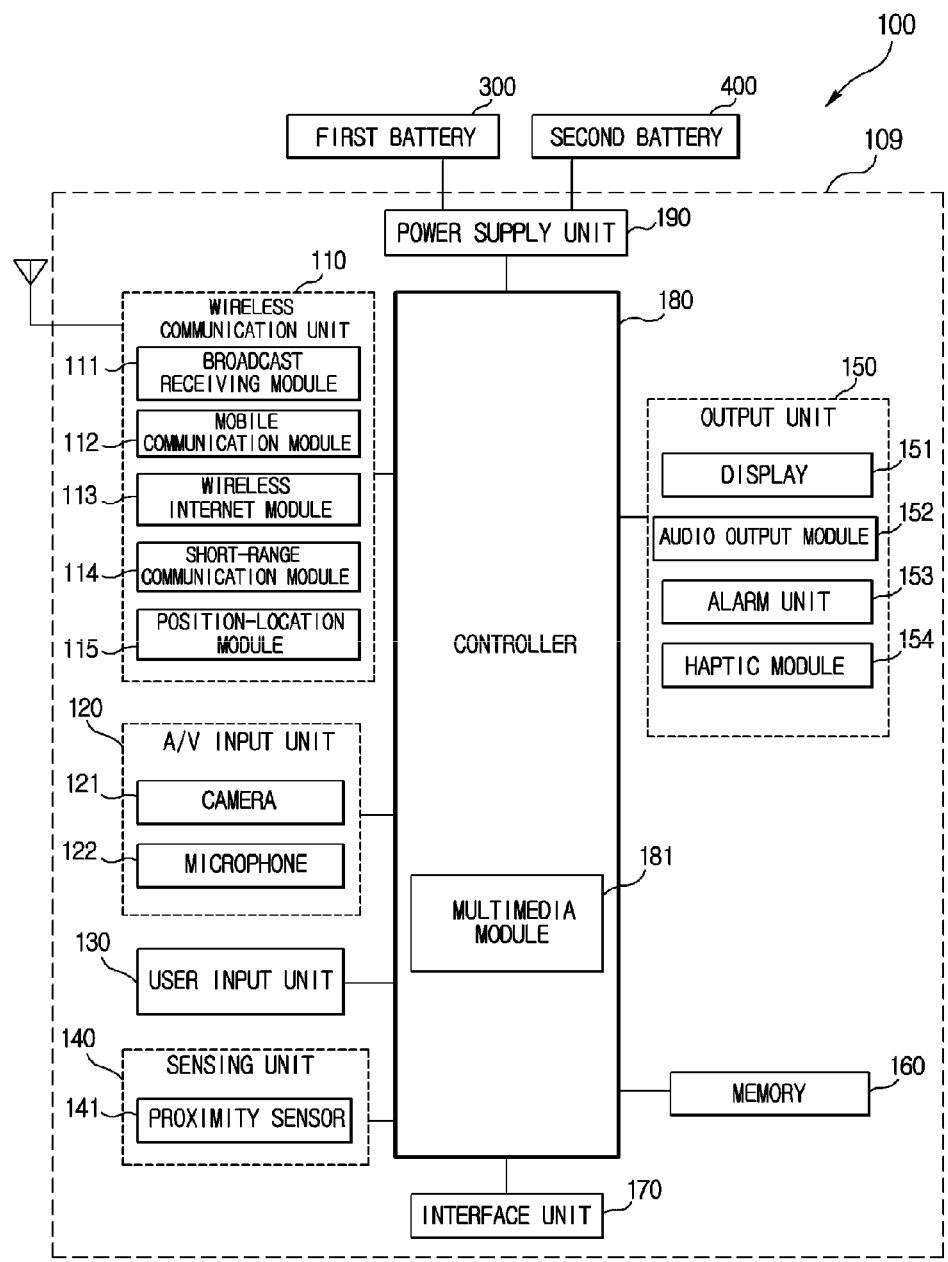

MOBILE TERMINAL WITH MULTIPLE BATTERIES

CROSS-REFERENCE TO RELATED APPLICATIONS

Pursuant to 35 U.S.C. §119(a), this application claims the benefit of earlier filing date and right of priority to Korean Patent Application Nos. 10-2009-0062135, filed on Jul. 8, 2009, 10-2009-0073409, filed on Aug. 10, 2009, and 10-2009-0073403, filed on Aug. 10, 2009, the contents of all of which are hereby incorporated by reference in their entireties.

FIELD OF THE DISCLOSURE

The present disclosure relates to a mobile terminal with at least two or more batteries.

DISCUSSION OF THE RELATED ART

Generally, terminals such as mobile terminals are intended for portability, and employ a battery as a power supply unit. A mobile terminal uses an intrinsically-designed battery cell for satisfying voltage and current characteristics adequate for the mobile terminal The mobile terminal is also supplied with a secondary cell capable of being charged for reuse by a user. The secondary cell may include a lithium ion cell, a nickel-cadmium cell and a nickel-hydrogen cell.

Development of technologies helps a battery cell provided along with a mobile terminal to track developing trends. For instance, the life of the battery cell has been gradually increased, and the battery cell has been gradually reduced in size and weight. However, the battery cell suffers from a drawback in that its use time is limited despite continuing developments.

FIG. 1 is a rear view of a mobile terminal 1 according to prior art.

Referring to FIG. 1, the conventional mobile terminal 1 includes a battery cell (15) disposed at its rear surface. A body (10) of the conventional mobile terminal has only one slot for installing the battery cell (15), and the battery cell (15) can be attached to or detached from the body (10) by locking or unlocking a button disposed at an upper end of the battery cell (15).

The body (10) and the battery cell (15) are connected by an electrically interconnecting power terminal (or electrical terminal), and disconnecting the body (10) and the battery cell (15) together with separation of the body or battery cell from the power terminal turns off the mobile terminal.

As mentioned above, the capacity of the battery cell (15) is limited. Therefore, usage of the mobile terminal frequently must cease due to complete discharge of the battery cell (15) even if the mobile terminal is in the midst of being used.

In some cases, an auxiliary battery cell may be carried along to replace the battery cell, but the electrical terminal must be separated when replacing the battery cell to turn off the power source of the mobile terminal. In a case that the battery cell is completely drained an important telephone communication must be stopped, causing the inconvenience of attempting a re-communication following the replacement of the battery cell even if an auxiliary battery is available on the spot.

Another drawback is that all on-going operations may be cancelled due to a drained-out battery cell in the midst of receiving a wireless data service using the mobile terminal, causing the inconvenience of reentry into a relevant menu by re-connecting to a wireless data service following the replacement of the battery cell.

Still another drawback is that data loading must be stopped due to a drain-out of the battery cell in the midst of receiving a large quantity of data using the mobile terminal, and a user may suffer from time and economic losses due to difficulty in successive loading of files.

Also, as functions of the terminal are diversified, the mobile terminal is implemented, for example, as a multimedia player provided with composite functions such as photographing of photos or moving pictures, playback of music or moving picture files, game play, and broadcast reception. The user of the mobile terminal may desire a part of the configuration of the mobile terminal to be mechanically separated with regard to a particular function.

Also, there may be a need for implementing an urgent call in a case where the battery residual level of the mobile terminal is not sufficient enough to operate the mobile terminal.

SUMMARY OF THE DISCLOSURE

Objects of the present disclosure are directed to provide a mobile terminal with multiple batteries, suitable for convenient usage by a user.

Furthermore, objects of the present disclosure are directed to provide a mobile terminal with multiple batteries, for which a user can readily check an operating status of each of the multiple batteries.

Still furthermore, objects of the present disclosure are directed to provide a mobile terminal with multiple batteries, capable of conducting an additional function by using a separable battery.

Still furthermore, objects of the present disclosure are directed to provide a mobile terminal with multiple batteries, capable of conducting an emergency call even if all the battery charge level is insufficient.

According to one general aspect of the present disclosure, a mobile terminal includes: first and second batteries supplying a driving power to constituent elements of the mobile terminal; an output unit outputting (displaying) an inner state (or operational state) of the mobile terminal to a user; and a controller notifying the user of charged levels of the first and second batteries.

According to another general aspect of the present disclosure, a mobile terminal includes: first and second batteries supplying a driving power to constituent elements of the mobile terminal; an output unit outputting (e.g., displaying) content to a user; a user input unit receiving a command of the user; and a controller informing the user of charge levels of the first and second batteries, and performing inter-charging between the first and second batteries upon receiving the command from the user.

According to still another general aspect of the present disclosure, a mobile terminal includes: a body; a first battery supplying a driving power to the body; and a second battery detachable from the body under a normal use (e.g., nominal operation) by a user, and supplying driving power to the body and a function that is distinguishable from the power supply unit function.

According to still another general aspect of the present disclosure, a mobile terminal includes: first and second batteries supplying a driving power to a body of the mobile terminal; a power supply unit transmitting a power supplied from the first battery or the second battery to the body of the mobile terminal; an emergency charge circuit charging the first battery using a charged power of the second battery; and a charger charging the first battery or the second battery using an external power source.

According to still another general aspect of the present disclosure, an emergency charging method performed by a mobile terminal including first and second batteries includes: comparing a charged level of the second battery with a first reference level; comparing the charged level of the second battery with a second reference level if the charged level of the second battery is lower than the first reference level; comparing the charged level of the second battery with a third reference level if the charged level of the first battery is lower than the second reference level; and charging the first battery using a residual power of the second battery if the charged level of the second battery is higher than the third reference level.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 2 is a block diagram of a mobile terminal according to an exemplary embodiment;

DETAILED DESCRIPTION

Figure 1:
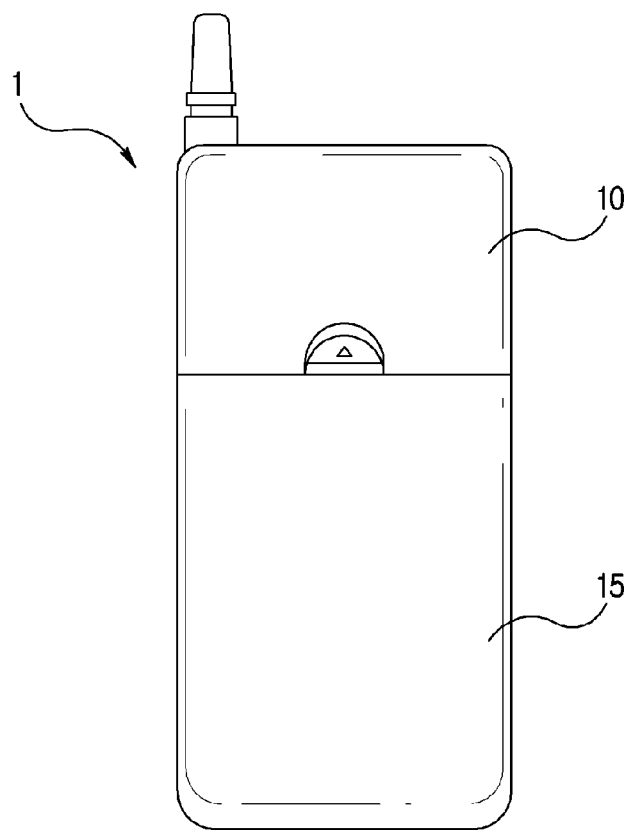
FIG. 1 is a plan view illustrating a mobile terminal according to the prior art.

Prior to description of the present disclosure, operating modes of a mobile terminal according to embodiments of the present invention will be described.

A mobile terminal according to an embodiment of the present invention may be operated under a "normal mode" and a "power save mode" in a similar manner as a conventional mobile terminal. The "normal mode" is an optimum use mode in which a mobile terminal can fully demonstrate its ability and functions. The mobile terminal under the normal mode can maintain display at a brightness suitable for comfortable recognition by a user, can perform additional functions such as Bluetooth™, mp3 player and DMB, and is in a state of instantly running HW/SW modules for additional functions in response to a user command.

A mobile terminal under the "power save mode" is in a state of performing almost all the functions of a mobile terminal, but is driven in a power-consumption-reducing set-up mode in which the brightness at which a display is maintained (that may consume a large amount of power) is reduced and display of a display screen is turned off after lapse of a predetermined time.

An "emergency mode," as described in the present disclosure, is an operational mode of a mobile terminal for a state of emergency in which an urgent call must be performed despite a low charged level of a battery.

A mobile terminal under the "emergency mode" may activate fundamental functions only and deactivate other additional functions. For example, a mobile terminal under the emergency mode may deactivate all functions other than an audio call function and a text message transmitting/receiving function. Furthermore, the classification of activated functions and deactivated functions under the emergency mode may be changed in accordance with one or more implementations and may be actively set up by a user.

An "idle screen," as described in the present disclosure, refers to a screen that is outputted (displayed) on a display screen when a mobile terminal is in a waiting state of a call without performing a call. The idle screen may be turned off unless there is a user manipulation of the mobile terminal during a predetermined time period, in order to save power consumption, but may be turned on again in response to a user key input.

FIG. 2 is a block diagram of a mobile terminal according to an exemplary embodiment of the present invention.

FIG. 2 shows a mobile terminal (100) having various components, although other components may also be used. A greater or fewer number of components may alternatively be implemented.

FIG. 2 shows that the mobile terminal (100) includes a wireless communication unit (110), an audio/video (A/V) input unit (120), a user input unit (130), a sensing unit (140), an output unit (150), a memory (160), an interface unit (170), a controller (180) and a power supply unit (190).

The wireless communication unit (110) may be configured with several components and/or modules. The wireless communication unit (110) may include a broadcast receiving module (111), a mobile communication module (112), a wireless Internet module (113), a short-range communication module (114) and a position-location module (115).

The wireless communication unit (110) may include one or more components that permit wireless communication between the mobile terminal (100) and a wireless communication system or a network within which the mobile terminal (100) is located. In the case of non-mobile terminals, the wireless communication unit (110) may be replaced with a wired communication unit. The wireless communication unit (110) and the wired communication unit may be commonly referred to as a communication unit.

The broadcast receiving module (111) may receive a broadcast signal and/or broadcast associated information from an external broadcast managing entity via a broadcast channel. The broadcast channel may include a satellite channel and a terrestrial channel. The broadcast managing entity may refer to a system that transmits a broadcast signal and/or broadcast associated information.

At least two broadcast receiving modules (111) may be provided in the mobile terminal (100) to facilitate simultaneous reception of at least two broadcast channels or broadcast channel switching Examples of broadcast associated information may include information associated with a broadcast channel, a broadcast program, or a broadcast service provider. For example, broadcast associated information may include an electronic program guide (EPG) of digital multimedia broadcasting (DMB) and an electronic service guide (ESG) of digital video broadcast-handheld (DVB-H).

The broadcast signal may be a TV broadcast signal, a radio broadcast signal, and/or a data broadcast signal. The broadcast signal may further include a broadcast signal combined with a TV or radio broadcast signal.

The broadcast receiving module (111) may receive broadcast signals transmitted from various types of broadcast systems. As a non-limiting example, the broadcasting systems may include digital multimedia broadcasting-terrestrial (DMB-T), digital multimedia broadcasting-satellite (DMB-S), digital video broadcast-handheld (DVB-H), a data broadcasting system known as media forward link only (Media-FLO®) and integrated services digital broadcast-terrestrial (ISDB-T). The receiving of multicast signals may also be provided. Data received by the broadcast receiving module (111) may be stored in the memory (160), for example.

The mobile communication module (112) may communicate wireless signals with one or more network entities (e.g. a base station or Node-B). The signals may represent audio, video, multimedia, control signaling, and data.

The wireless Internet module (113) may support Internet access for the mobile terminal (100). This wireless Internet module (113) may be internally or externally coupled to the mobile terminal (100). Suitable technologies for wireless Internet may include, but are not limited to, WLAN (Wireless LAN) (Wi-Fi), Wibro (Wireless broadband), Wimax (World Interoperability for Microwave Access), and/or HSDPA (High Speed Downlink Packet Access). The wireless Internet module (113) may be replaced with a wired Internet module in non-mobile terminals. The wireless Internet module (113) and the wired Internet module may be referred to as an Internet module.

The short-range communication module (114) may facilitate short-range communications. Suitable technologies for short-range communication may include, but are not limited to, radio frequency identification (RFID), infrared data association (IrDA), ultra-wideband (UWB), as well as networking technologies such as Bluetooth™ and ZigBee™.

The position-location module (115) may identify or otherwise obtain a location of the mobile terminal (100). The position-location module (115) may be provided using global positioning system (GPS) components that cooperate with associated satellites, network components, and/or combinations thereof.

The position-location module (115) may precisely calculate current 3-dimensional position information based on longitude, latitude and altitude by calculating distance information and precise time information from at least three satellites and then by applying triangulation to the calculated information. Location and time information may be calculated using three satellites, and errors of the calculated location position and time information may then be amended or changed using another satellite. The position-location module (115) may calculate speed information by continuously calculating a real-time current location.

The audio/video (A/V) input unit (120) may provide audio or video signal input to the mobile terminal (100). The A/V input unit (120) may include a camera (121) and a microphone (122). The camera (121) may receive and process image frames of still pictures and/or video.

The microphone (122) may receive an external audio signal while the mobile terminal is in a particular mode, such as a phone call mode, a recording mode and/or a voice recognition mode. The received audio signal may then be processed and converted into digital data.

The mobile terminal (100), and in particular the A/V input unit (120), may include a noise removing algorithm (or noise canceling algorithm) to remove noise generated in the course of receiving the external audio signal. Data generated by the A/V input unit (120) may be stored in the memory (160), utilized by the output unit (150), and/or transmitted via one or more modules of the wireless communication unit (110). Two or more microphones and/or cameras may also be provided.

The user input unit (130) may generate input data responsive to user manipulation of an associated input device or devices. Examples of such devices may include a keypad, a dome switch, a touchpad (e.g., static pressure/capacitance), a jog wheel and/or a jog switch. A specific example is one in which the user input unit (130) is configured as a touchpad in cooperation with a display, as will be described below.

The sensing unit (140) may provide status measurements of various aspects of the mobile terminal (100). For example, the sensing unit (140) may detect an open/close status (or state) of the mobile terminal (100), a relative positioning of components (e.g., a display and a keypad) of the mobile terminal (100), a change of position of the mobile terminal (100) or a component of the mobile terminal (100), a presence or absence of user contact with the mobile terminal (100), and/or an orientation or acceleration/deceleration of the mobile terminal (100).

The mobile terminal (100) may be configured as a slide-type mobile terminal. In such a configuration, the sensing unit (140) may sense whether a sliding portion of the mobile terminal (100) is open or closed. The sensing unit (140) may also sense presence or absence of power provided by the power supply unit (190), and presence or absence of a coupling or other connection between the interface unit (170) and an external device.

The sensing unit (140) may include a proximity sensor (141).

The output unit (150) may generate an output perceptible using a sight sense, an auditory sense, and/or a tactile sense. The output unit (150) may include a display (151), an audio output module (152), an alarm unit (153), and/or a haptic module (154).

The display (151) may display (output) information processed by the terminal (100). For example, when the terminal is in a call mode, the display (151) may display a user interface (UI) or a graphic user interface (GUI) associated with the call. If the mobile terminal (100) is in a video communication mode or a photograph mode, the display (151) may display a photographed and/or received picture, a UI or a GUI.

The display (151) may include at least one of a liquid crystal display (LCD), a thin film transistor liquid crystal display (TFT LCD), an organic light-emitting diode (OLED), a flexible display, and a 3-dimensional display.

The display (151) may have a transparent or light-transmissive type configuration to enable an external environment to be seen through. This may be called a transparent display. A transparent OLED (TOLED) may be an example of a transparent display. A rear structure of the display (151) may also have the light-transmissive type configuration. In this configuration, a user may see an object located behind the terminal body through the area occupied by the display (151) of the terminal body.

At least two displays (151) may also be provided. For example, a plurality of displays may be provided on a single face of the terminal (100) by being built in one body or spaced apart from each other on the single face. Alternatively, each of a plurality of displays may be provided on different faces of the terminal (100).

If the display (151) and a sensor for detecting a touch action (hereinafter, a touch sensor) are constructed in a mutual-layered structure (hereinafter, a touch screen), the display (151) may be used as an input device as well as an output device. For example, the touch sensor may include a touch film, a touch sheet, and/or a touchpad.

The touch sensor may convert a pressure applied to a specific portion of the display (151) or a variation of electrostatic capacity generated from a specific portion of the display (151) to an electric input signal. The touch sensor may detect a pressure of a touch as well as a position and size of the touch.

If a touch input is provided to the touch sensor, signal(s) corresponding to the touch input may be transferred to a touch controller. The touch controller may process the signal(s) and then transfer corresponding data to the controller (180). The controller (180) may therefore know which portion of the display (151) is touched.

FIG. 2 shows that the proximity sensor (141) can be provided within the mobile terminal (100) enclosed by the touch screen or around the touch screen. The proximity sensor (141) may detect a presence or non-presence of an object approaching a prescribed detecting surface or an object existing around the proximity sensor (141) using an electromagnetic field strength or infrared ray without mechanical contact. The proximity sensor (141) may have a longer durability than the contact type sensor and may also have a greater usage than the contact type sensor.

The proximity sensor (141) may include one of a transmittive photoelectric sensor, a direct reflective photoelectric sensor, a mirror reflective photoelectric sensor, a radio frequency oscillation proximity sensor, an electrostatic capacity proximity sensor, a magnetic proximity sensor, and/or an infrared proximity sensor. If the touch screen is an electrostatic type, the proximity sensor (141) may detect proximity of a pointer using a variation of an electric field according to the proximity of the pointer. In this case, the touch screen (touch sensor) may be classified into (or as part of) the proximity sensor.

An action in which a pointer approaches the touch screen without contacting the touch screen may be called a proximity touch. An action in which a pointer actually touches the touch screen may be called a contact touch. The location of the touch screen proximity-touched by the pointer may be the position of the pointer that vertically opposes the touch screen when the pointer performs the proximity touch.

The proximity sensor (141) may detect a proximity touch and/or a proximity touch pattern (e.g., a proximity touch distance, a proximity touch duration, a proximity touch position, or a proximity touch shift state). Information corresponding to the detected proximity touch action and/or the detected proximity touch pattern may be outputted to the touch screen.

The audio output module (152) may output audio data that is received from the wireless communication unit (110) in a call signal reception mode, a call mode, a recording mode, a voice recognition mode, and/or a broadcast receiving mode. The audio output module (152) may output audio data stored in the memory (160). The audio output module (152) may output an audio signal relevant to a function (e.g., a call signal receiving sound, or a message receiving sound) performed by the mobile terminal (100). The audio output module (152) may include a receiver, a speaker, and/or a buzzer.

The alarm unit (153) may output a signal for announcing an event occurrence of the mobile terminal (100). An event occurring in the mobile terminal (100) may include one of a call signal reception, a message reception, a key signal input, and/or a touch input. The alarm unit (153) may output a signal for announcing an event occurrence by way of vibration as well as by a video signal or an audio signal. The video signal may be outputted via the display (151). The audio signal may be outputted via the audio output module (152). The display (151) or the audio output module (152) may be classified as part of the alarm unit (153).

The haptic module (154) may bring about various haptic effects that can be sensed by a user. Vibration is a representative example for the haptic effect brought about by the haptic module (154). A strength and pattern of the vibration generated from the haptic module (154) may be controllable. For example, vibrations differing from each other may be outputted in a manner of being synthesized together or may be sequentially outputted.

The haptic module (154) may generate various haptic effects including a vibration, an effect caused by a stimulus such as a pin array vertically moving against a contact skin surface, a jet power of air via outlet, a suction power of air via inlet, a skim on a skin surface, a contact of an electrode, or an electrostatic power, and/or an effect by hot/cold sense reproduction using an endothermic or exothermic device as well as the vibration.

The haptic module (154) may provide the haptic effect via direct contact. The haptic module (154) may enable a user to experience the haptic effect via muscular sense of a finger, and/or an arm. Two or more haptic modules (154) may be provided according to a configuration of the mobile terminal (100).

The memory (160) may store a program for operations of the controller (180). The memory (160) may temporarily store input/output data (e.g., phonebook, message, still picture, or moving picture). The memory (160) may store data of vibration and sound in various patterns outputted in case of a touch input to the touch screen.

The memory (160) may include at least one of a flash memory, a hard disk, a multimedia card micro type memory, a card type memory (e.g., SD memory, or XD memory), a random access memory (RAM), a static random access memory (SRAM), a read-only memory (ROM), an electrically erasable programmable read-only memory, a programmable read-only memory, a magnetic memory, a magnetic disk, and/or an optical disk. The mobile terminal (100) may operate in association with a web storage that performs a storage function of the memory (160) in the Internet.

The interface unit (170) may play a role as a passage to external devices connected to the mobile terminal (100). The interface unit (170) may receive data from an external device. The interface unit (170) may be supplied with power, and then the power may be delivered to elements within the mobile terminal (100). The interface unit (170) may enable data to be transferred to an external device from inside of the mobile terminal (100). The interface unit (170) may include a wired/wireless headset port, an external charger port, a wire/wireless data port, a memory card port, a port for coupling to a device having an identity module, an audio input/output (I/O) port, and/or a video input/output (I/O) port, an earphone port.

The identity module may be a chip or card that stores various kinds of information for authenticating use of the mobile terminal (100). The identify module may include a user identity module (UIM), a subscriber identity module (SIM), and/or a universal subscriber identity module (USIM). A device provided with the above identity module (hereafter, an identity device) may be manufactured in the form of a smart card. The identity device may be connected to the mobile terminal (100) via the port.

The interface unit (170) may play a role as a passage for supplying power to the mobile terminal (100) from a cradle that is connected to the mobile terminal (100). The interface unit (170) may play a role as a passage for delivering various command signals, which are inputted from the cradle by a user, to the mobile terminal (100). Various command signals inputted from the cradle or the power may work (or serve) as a signal (or indicator) for recognizing that the mobile terminal (100) is correctly loaded in the cradle.

The controller (180) may control overall operations of the mobile terminal (100). For example, the controller (180) may perform control and processing relevant to a voice call, a data communication, and/or a video conference. The controller (180) may have a multimedia module (181) for multimedia playback. The multimedia module (181) may be implemented within the controller (180) or may be configured separate from the controller (180).

The controller (180) may perform pattern recognizing processing for recognizing a handwriting input performed on the touch screen as a character and/or recognizing a picture drawing input performed on the touch screen as an image.

The power supply unit (190) may receive an external or internal power and then supply the power required for operations of the respective elements under control of the controller (180).

Embodiments of the present invention described more fully in the following description may be implemented within a recording medium that can be read by a computer or a computer-like device using software, hardware or a combination thereof.

According to the hardware implementation, arrangements and embodiments may be implemented using at least one of application specific integrated circuits (ASICs), digital signal processors (DSPs), digital signal processing devices DSPDs), programmable logic devices (PLDs), field programmable gate arrays (FPGAs), processors, controllers, microcontrollers, microprocessors and electrical units for performing other functions. In some cases, embodiments may be implemented by the controller (180).

For a software implementation, arrangements and embodiments described herein may be implemented with separate software modules, such as procedures and functions, each of which may perform one or more of the functions and operations described herein. Software codes may be implemented with a software application written in any suitable programming language and may be stored in memory such as the memory (160), and may be executed by a controller or processor, such as the controller (180).

A mobile terminal capable of displaying battery charge levels of a plurality of batteries will now be described with reference to exemplary embodiments.

The mobile terminal (100) illustrated in FIG. 2 may include: a first battery (300) supplying a driving power to a body (109) of the mobile terminal (hereinafter referred to as a body) including elements of the mobile terminal; and a second battery (400) supplying a driving power to the body (109) that is detachable from the mobile terminal under a normal use (e.g., a nominal operation) of the mobile terminal by a user (hereinafter referred to as a user).

A configuration of the first and second batteries (300, 400) may be one of the following examples.

The first battery (300) of a relatively small charging capacity and the second battery (400) of a large charging capacity may be combined. The first battery of a small capacity may be built in the mobile terminal so as not to be separated from the mobile terminal under a normal use by the user.

In a second configuration, the mobile terminal (100) may have a two-battery combination unit, where each of the two batteries may have a similar charging capacity and size, and may be fastened to any place (or portion) of the combination unit. The mobile terminal may be driven if at least one charged battery is fastened to the two-battery combination unit.

In a third configuration, when the mobile terminal (100) is fastened only to the first battery (300), the mobile terminal (100) may be used in a first portable configuration, and when the mobile terminal (100) is fastened with the first and second batteries, the mobile terminal may be used in the form of a second portable configuration.

The advantage is that the first portable configuration can provide the user with a portability in which the mobile terminal is reduced in overall size, while the second portable configuration can provide the user with a larger-capacity power supply unit.

The mobile terminal (100) of FIG. 2 may have a charging structure according to a charging strategy of two fastened batteries (300, 400). Alternatively, the mobile terminal (100) of FIG. 1 may have various power supply unit structures according to a charging strategy of receiving power from the fastened two batteries (300, 400).

The mobile terminal according to one exemplary embodiment may include (e.g., be mounted with) at least two batteries, and information on charged states (levels) of the at least two batteries may be notified to the user through a display.

The mobile terminal according to the present embodiment may include: first and second batteries supplying a driving power to constituent elements of the mobile terminal; a display displaying an inner state of the mobile terminal to a user; and a controller notifying the user of charged states (levels) of the first and second batteries.

Figure 3A:
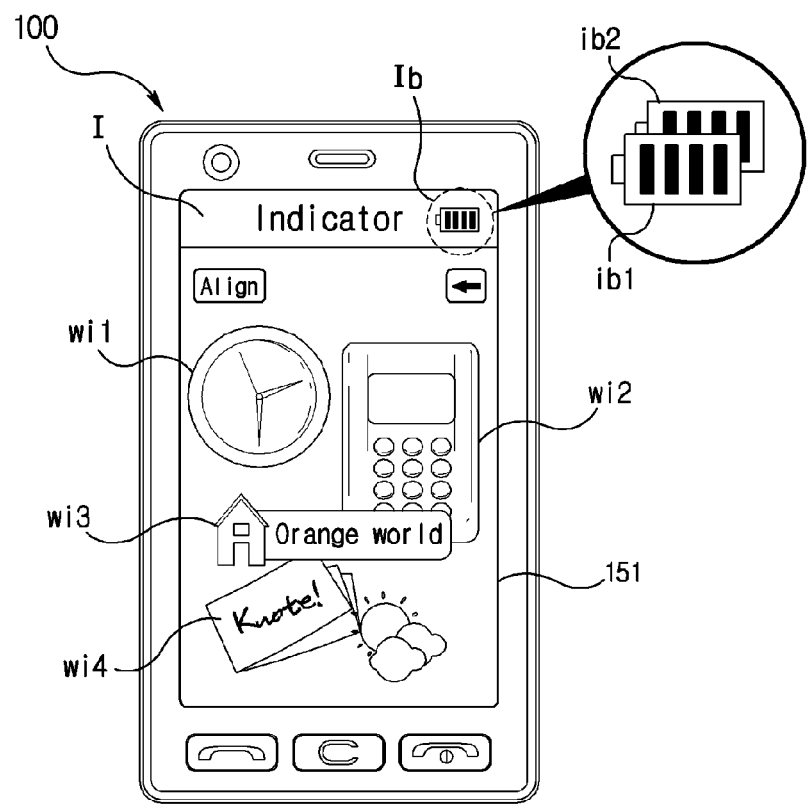
FIGS. 3a, 3b and 3c illustrate a display screen indicating a charged level of two batteries.

FIG. 3a illustrates a display screen having an indicator area (I) in which two battery icons (ib1, ib2) are displayed. The battery icons (ib1, ib2) respectively correspond to charged levels of the first battery and the second battery. In other words, the controller of the mobile terminal displays the charged levels of the first and second batteries by using two battery icons (ib1, ib2) in the indicator area (I).

Figure 3B:
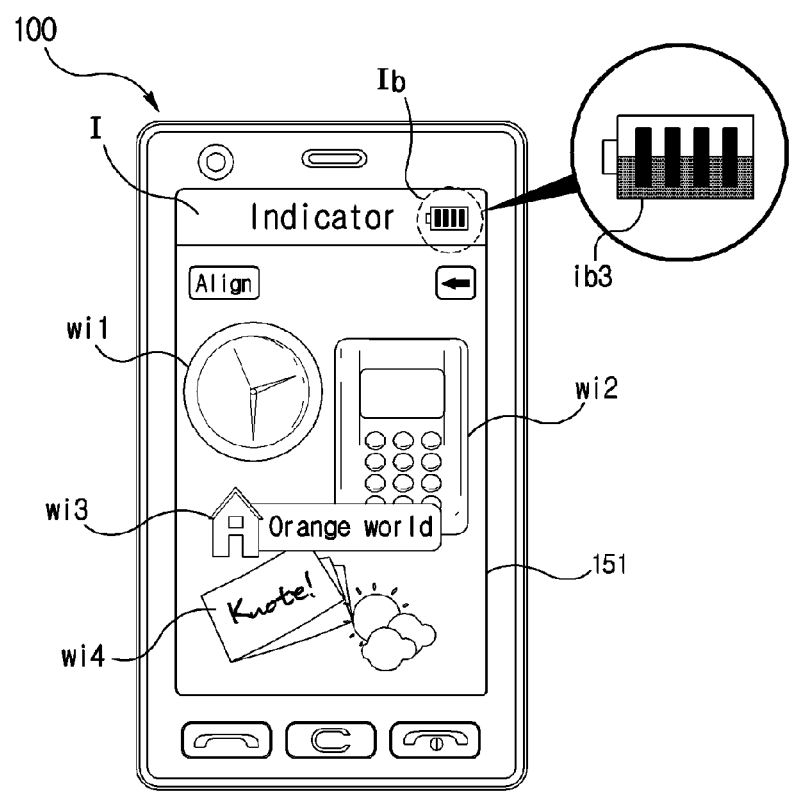

FIG. 3b illustrates the charged level of the second battery using a scale (e.g., vertical bars) as in the conventional battery icon, and illustrates a display screen having an indicator area (I) displaying a battery icon (ib3) indicating a charged level of the first battery using a level (e.g., a horizontal level) inside the battery icon. The controller of the mobile terminal of FIG. 3b displays charged levels of the first and second batteries by using scale and level of the battery icon (ib3).

Figure 3C:
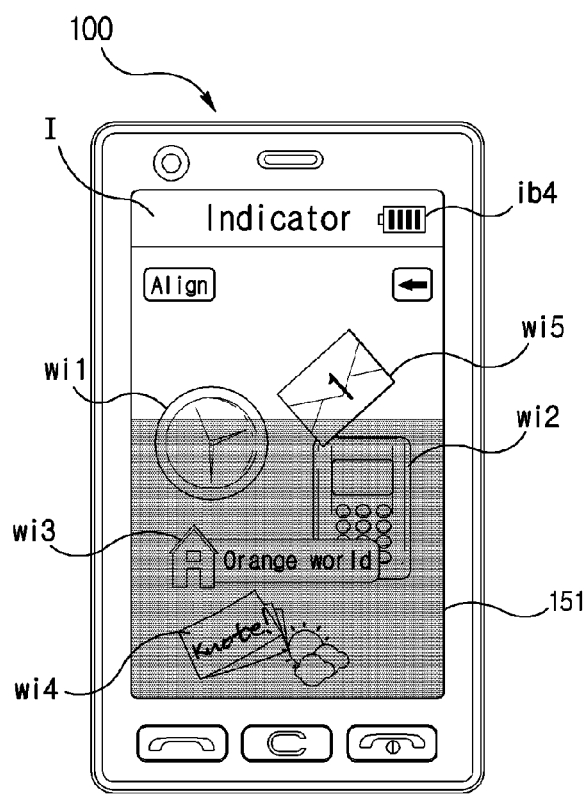

FIG. 3c illustrates a battery icon (ib4) of indicator area (I) and a display screen having a "water level" (e.g., a shading having a horizontal boundary level) on a wallpaper. The controller of the mobile terminal of FIG. 3c indicates the charged level of the second battery using the battery icon (ib4) and the charged level of the first battery using a water level on the wallpaper.

The display screens of FIGS. 3a, 3b and 3c may display various widgets (wi 1 to wi 5). With reference to FIG. 3, a widget, such as widget (wi 5), when executed by user selection, may be displayed using animation showing that the widget is submerged in the water level to indicate the charged level of the first battery.

Figure 4A:
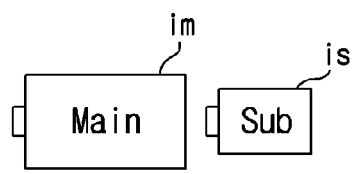
FIGS. 4a, 4b and 4c illustrate a display screen indicating use, charge and status of two batteries.
Figure 4B:
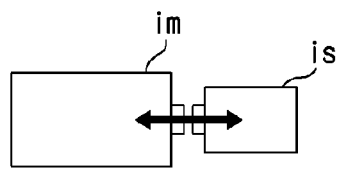
Figure 4C:
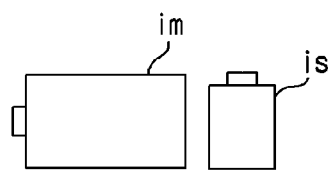

FIGS. 4a, 4b and 4c illustrate the first and second batteries using electrode images (im, is), each of the electrodes shown as having an anode and a cathode, and illustrate a display screen indicating use, charge and status of (e.g., standby) states of the first and second batteries. FIG. 4a illustrates the first and second batteries as being in use, FIG. 4b illustrates an inter-charging between the first battery and the second battery, and FIG. 4c illustrates that the second battery is not in use (e.g., a standby configuration) and only the first battery (im) is in use. The controller of the mobile terminal illustrates the first battery and the second battery as electrode images (im, is) each having an anode and a cathode, where use, charge and status states of the first battery and the second battery are expressed using the anode direction (e.g., the direction toward which the anode protrudes or points) of the corresponding illustrated electrode.

Figure 5A:
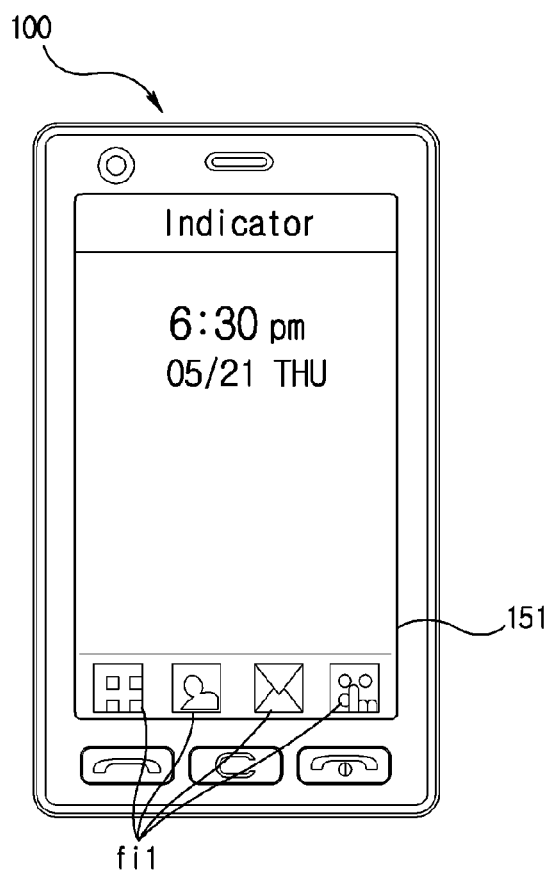
FIG. 5a illustrates a display screen showing an idle screen under a normal mode.

FIG. 5a illustrates an idle screen in the normal mode, and FIGS. 5b, 5c and 5d and FIG. 6 illustrate various exemplary embodiments of the idle screens in the emergency mode. As illustrated in the FIGS. 5 and FIG. 6, the idle screens in the emergency mode have a limited number of display items (only time is displayed) and simple designs.

Figure 5B:
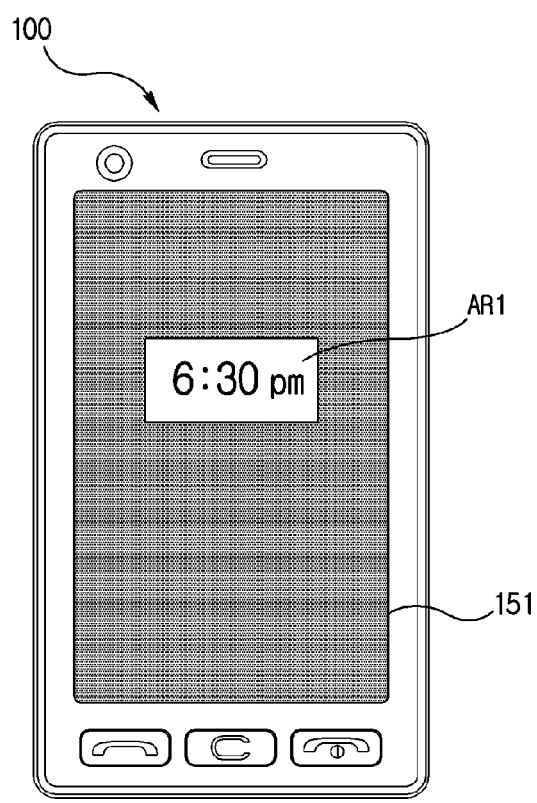
FIGS. 5b, 5c and 5d illustrate a display screen showing an idle screen under an emergency mode.
Figure 5C:
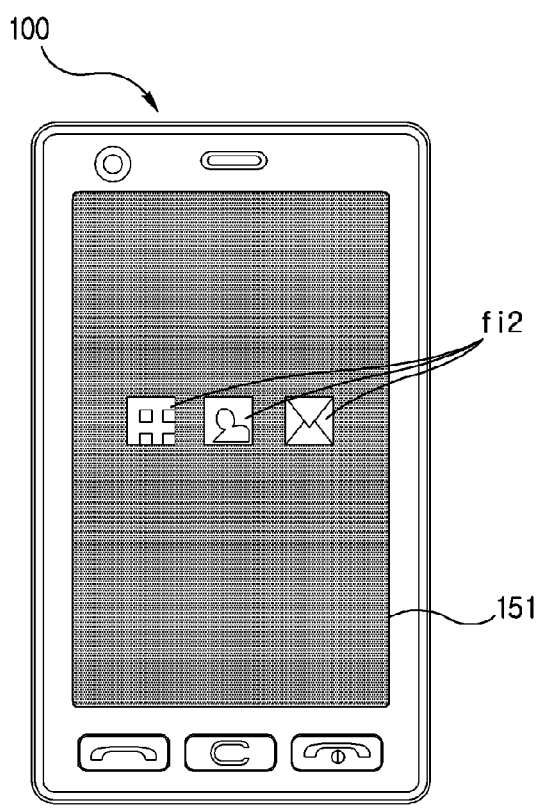

The idle screen of FIG. 5a displays only the time and date information, and icons (fi 1) of various functions, while the idle screen of FIG. 5b displays only the time display window (AR1). The idle screen of FIG. 5c displays only 3 (three) functional icons (fi 2) selected by default or by user selection.

Figure 5D:
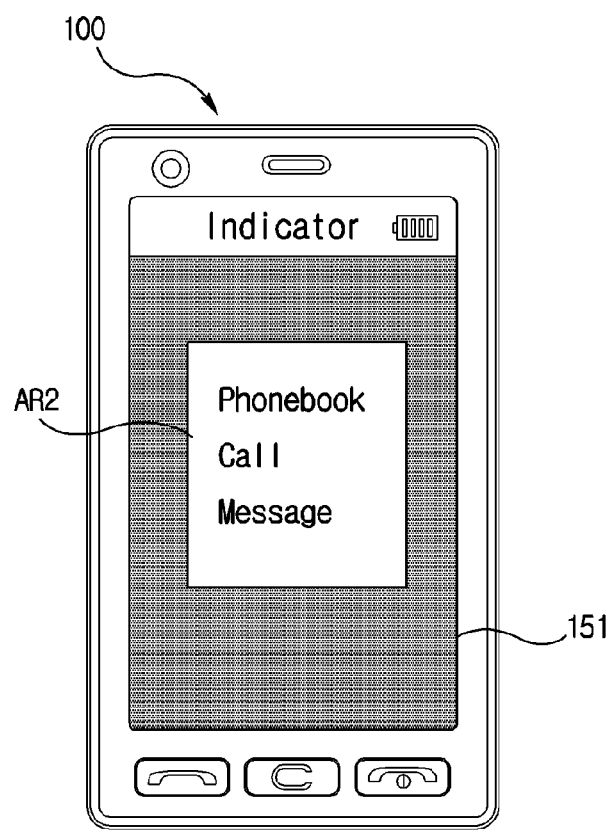

The idle screen of FIG. 5d displays a window (AR2) that occupies only a portion of the display screen. The LCD display may include a plurality of backlights, and may drive only the backlights that correspond to the portion occupied by the window (AR2) in the display screen in order to reduce the power consumption in the emergency mode.

In an emergency mode, a controller of the mobile terminal may provide idle screens (see FIGS. 5b to 5d) different from that of a normal mode (see FIG. 5a), where a user interface screen in the emergency mode has a simpler shape than in the normal mode. For example, the idle screen in the emergency mode may have a dark background color for reducing a power consumption caused by the display. For example, the idle screen of the emergency mode may be configured to display a black and white image to increase the likelihood that the user will become aware of the lack of power.

Figure 6:
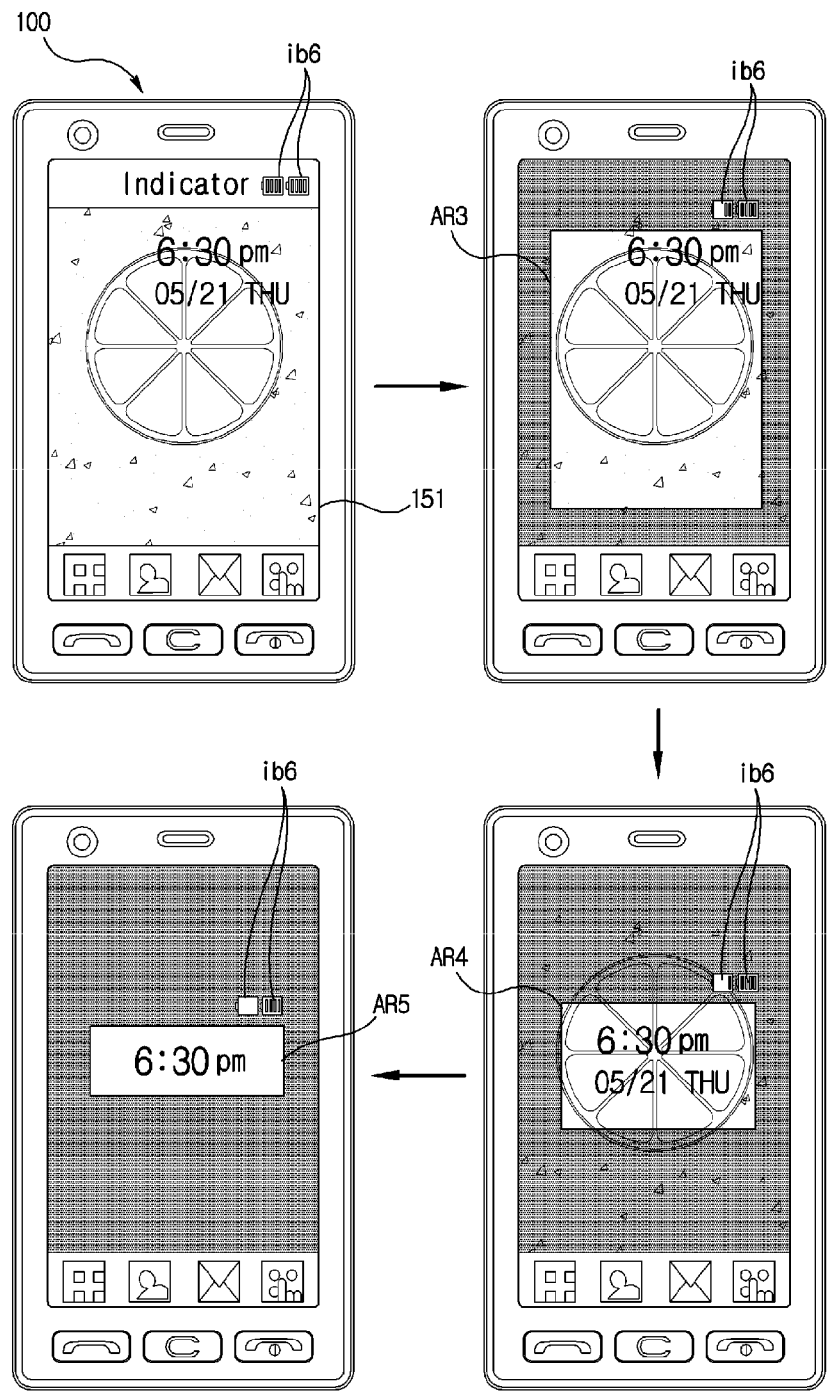
FIG. 6 illustrates a display screen showing idle screens of areas corresponding to a charged level of a battery.

Idle screens of FIG. 6 may have display areas (AR3, AR4, AR5) corresponding to respective charged levels in order to reduce power consumption caused by the display or to indicate the charged levels of the batteries. FIG. 6 illustrates idle screens corresponding to increasingly low charged levels of one of the batteries, as indicated by one of the battery icons (ib 6). Under this circumstance, only the backlights that illuminate the display areas (AR3, AR4, AR5) may be driven to save the power consumption in the emergency mode.

FIGS. 7 to 10 illustrate exemplary embodiments of conversions between the normal mode and the emergency mode of the mobile terminal.

Figure 7:
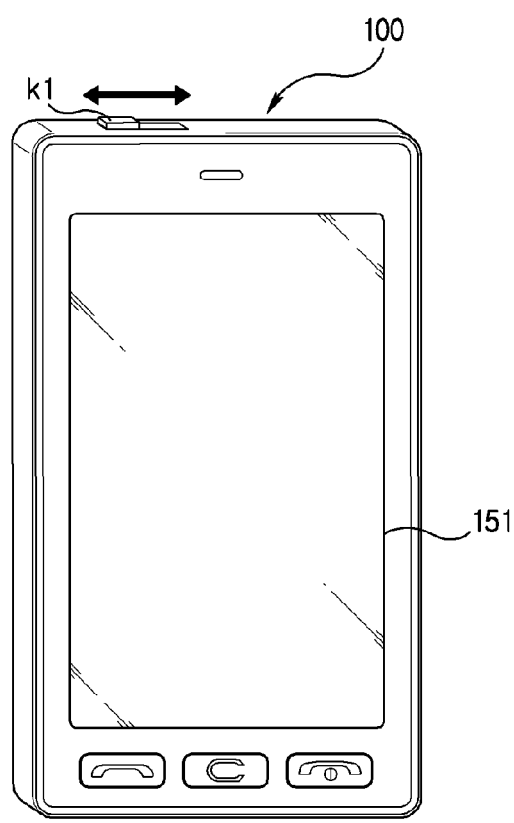
FIGS. 7, 8, 9 and 10 illustrate a display screen indicating conversions between a normal mode and an emergency mode of a mobile terminal.

A mobile terminal (100) of FIG. 7 includes a separate hardware key (k1) for inter-conversion between the normal mode and the emergency mode, where the user may perform the inter-conversion between the normal mode and the emergency mode in response to movement (e.g., manual operation) of the separate hardware key (k1).

Figure 8:
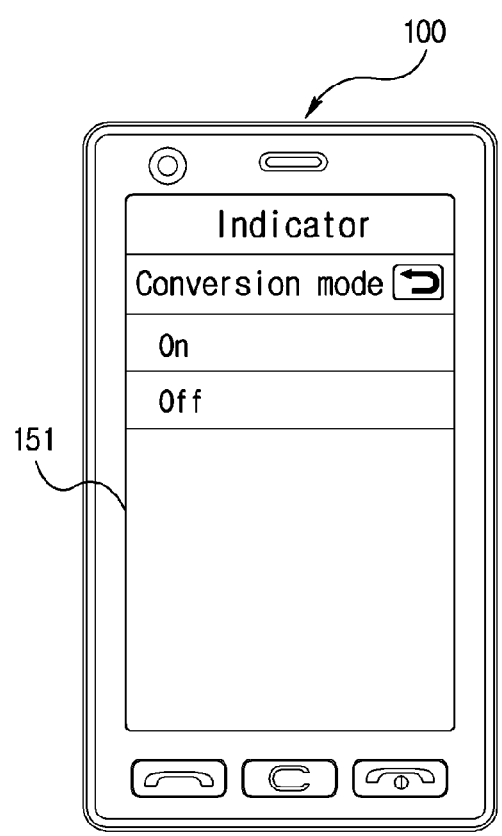

A mobile terminal (100) of FIG. 8 displays a separate menu for inter-conversion between the normal mode and the emergency mode. When the user selects ON/OFF of the emergency mode using the menu, the mobile terminal performs the inter-conversion between the normal mode and the emergency mode in response to the ON/OFF command.

Figure 9:
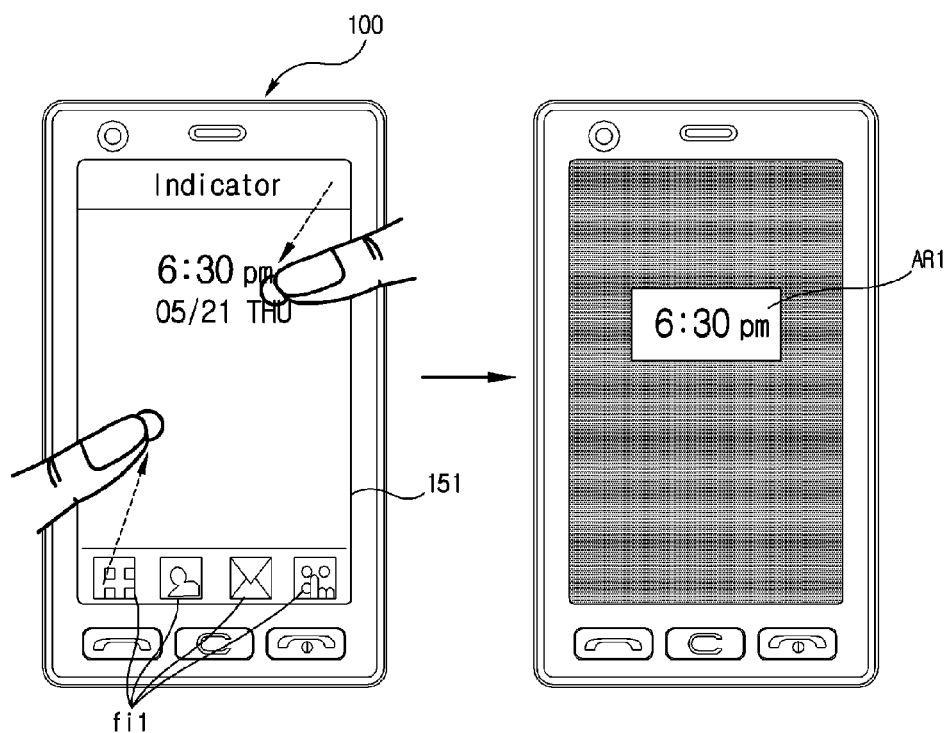
Figure 10:
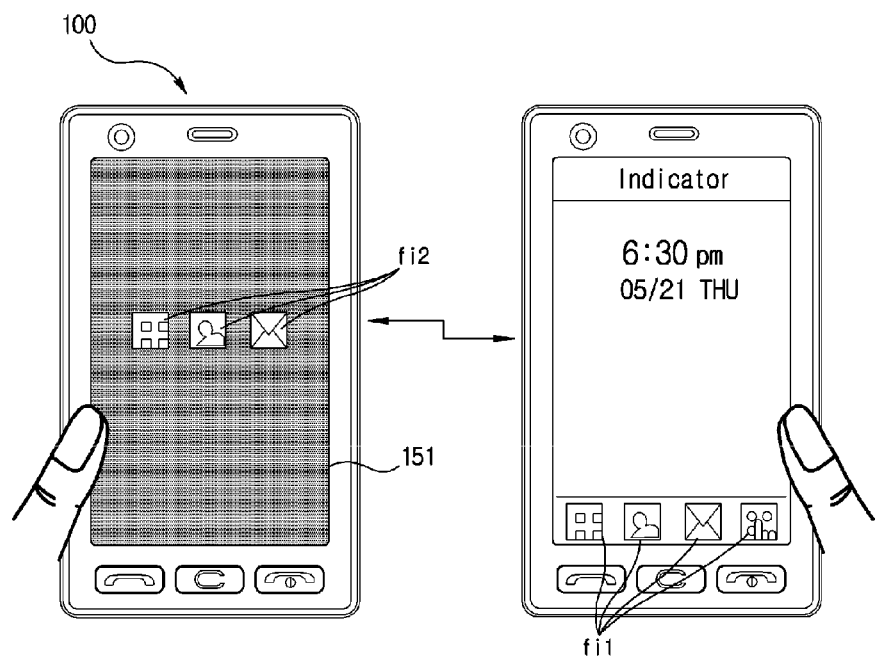

FIGS. 9 and 10 illustrate a display screen indicating the inter-conversion between the normal mode and the emergency mode by applying a certain designated pattern to a touch screen mounted on the mobile terminal (100). The controller of the mobile terminal of FIGS. 9 and 10 may switch the mobile terminal to an emergency mode if it senses that a designated touch or a drag pattern is applied to a user interface screen of a normal mode.

For example, as shown in FIG. 9, when the user applies a pattern on the touch screen in which two adjacent points are merged to a center point in a concurrent manner while an idle screen in the normal mode is displayed, the mobile terminal may be converted to an emergency mode.

For example, as shown in FIG. 10, when a right side of the idle screen is touched during normal mode, the mobile terminal may be converted to an emergency mode, and a touch to the left side of the idle screen during emergency mode can convert the mobile terminal back to the normal mode.

Figure 11A:
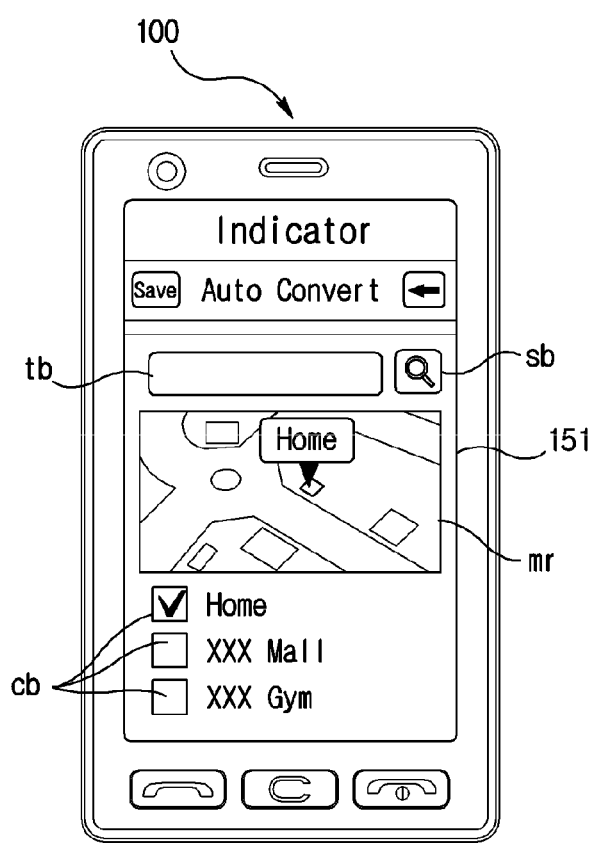
FIGS. 11a, 11b, 12a and 12b illustrate a display screen indicating performance of conversion between a normal mode and an emergency mode according to a position (or location) of a mobile terminal.

FIGS. 11*a*/11*b* and 12*a*/12*b* illustrate display screens displaying the performance of inter-conversion between the normal mode and the emergency mode according to a position (e.g., location) of the mobile terminal (100). The controller of the illustrated mobile terminal is configured to control the mobile terminal to operate under an emergency mode if the mobile terminal is situated at a designated area (e.g., a location such as "Home," "XXX Mall," or "XXX Gym"), and to control the mobile terminal to operate under a normal mode if the mobile terminal is positioned in another area (e.g., another location).

Figure 11B:
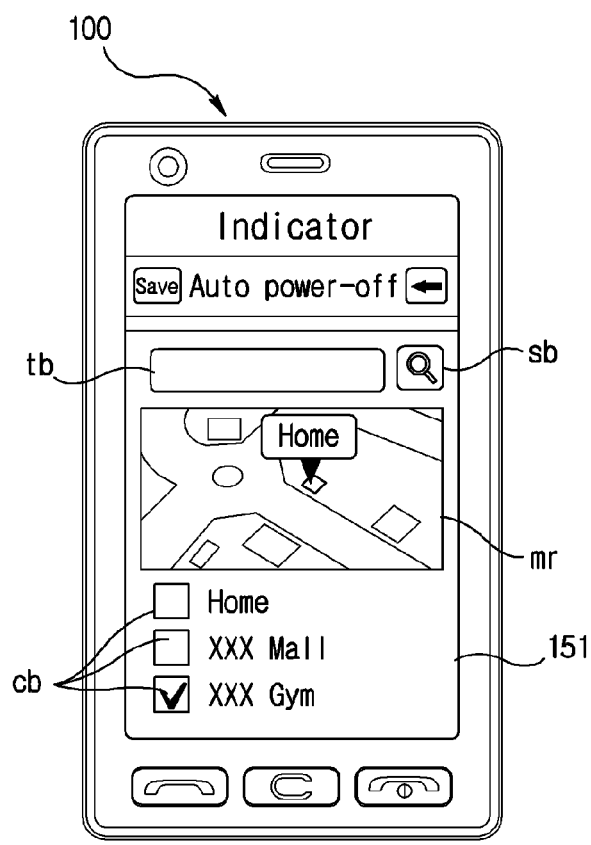

FIG. 11*a* illustrates a display screen in which an area at which the mobile terminal is to be converted to an emergency mode is selected, and FIG. 11*b* illustrates a display screen in which an area at which the mobile terminal is to be powered off (e.g., auto powered-off) is selected.

Referring to FIGS. 11A and 11B, a predetermined map (mr) is displayed in the illustrated set-up screen, and the user selects a certain area (e.g., location) of the map (mr) as an area at which the mobile terminal is to be converted to an emergency mode (or an area at which the mobile terminal is to be powered off). As a result, a certain area on the map is set up as an area used by the mobile terminal for converting to the emergency mode (or autonomously powering off the mobile terminal), and the controller of the mobile terminal may control the mobile terminal to convert to an emergency mode (or turn off the mobile terminal) if it is determined that the mobile terminal is situated (e.g., positioned) at the certain area.

The illustrated set-up screen may indicate points (e.g., specific locations) for which the user has input names in advance, and may indicate check boxes (cb), so that the indicated locations can be selected by the user as an area at which the emergency mode is to be used. The illustrated set-up screen may display a window (tb) for inputting a name of a point to be searched on the map and a search button (sb) as in a conventional map search system.

Figure 12A:
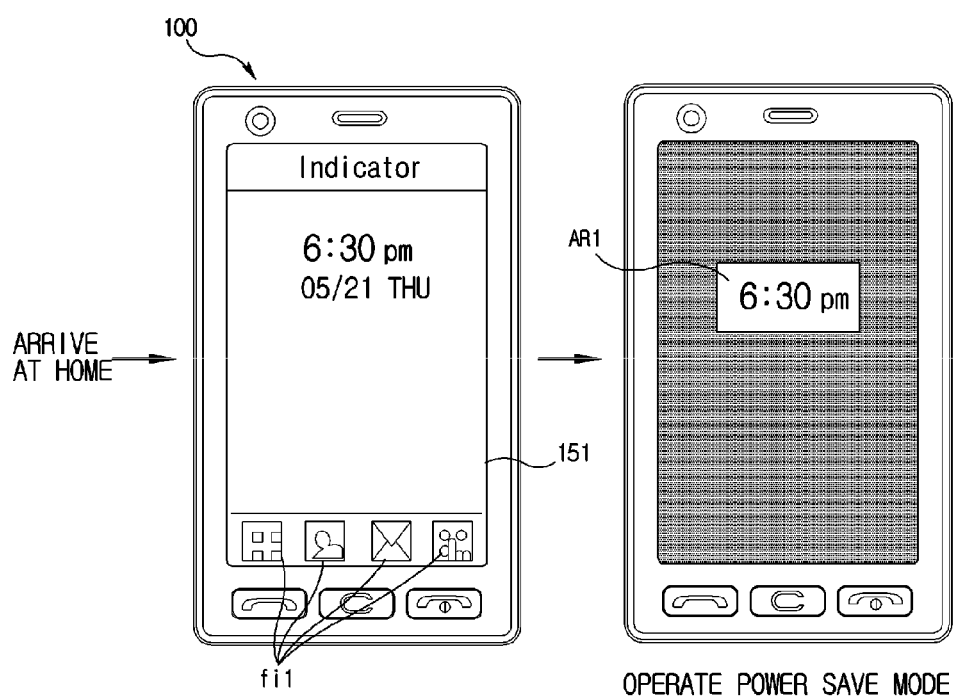
Figure 12B:
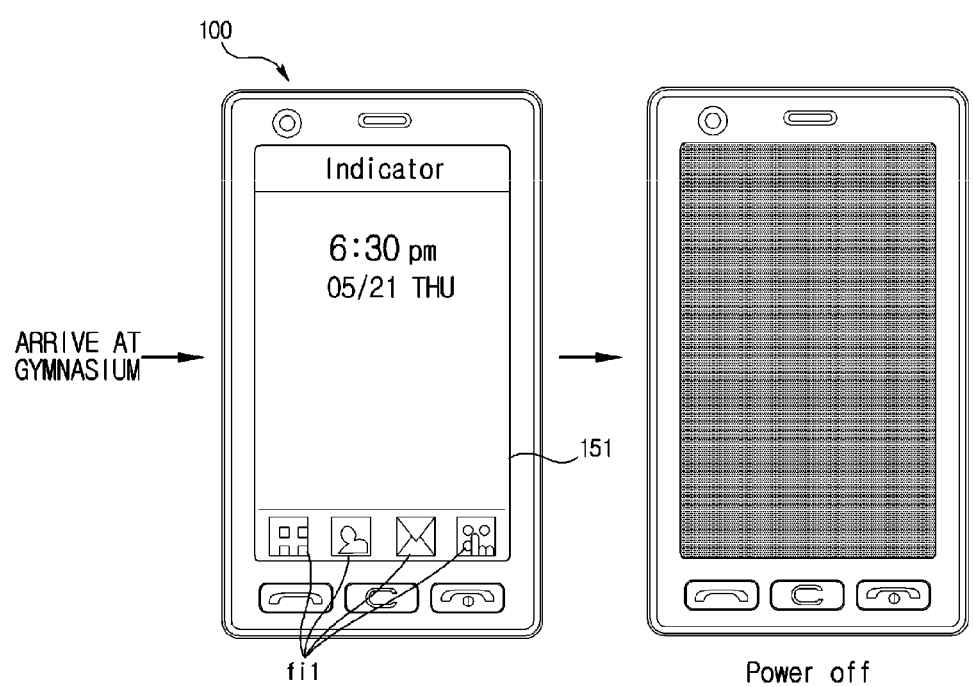

FIG. 12*a* illustrates an entry into (e.g., conversion to) an emergency mode when the mobile terminal is moved to a designated location (e.g., "home"). The mobile terminal may be powered off if it is moved to another designated location (e.g., "gymnasium"), as shown in FIG. 12*b*. The mobile terminal may determine its position (or location) by receiving a GPS (Global Positioning System) satellite signal, or using strength of receiving/transmitting signals.

Figure 13:
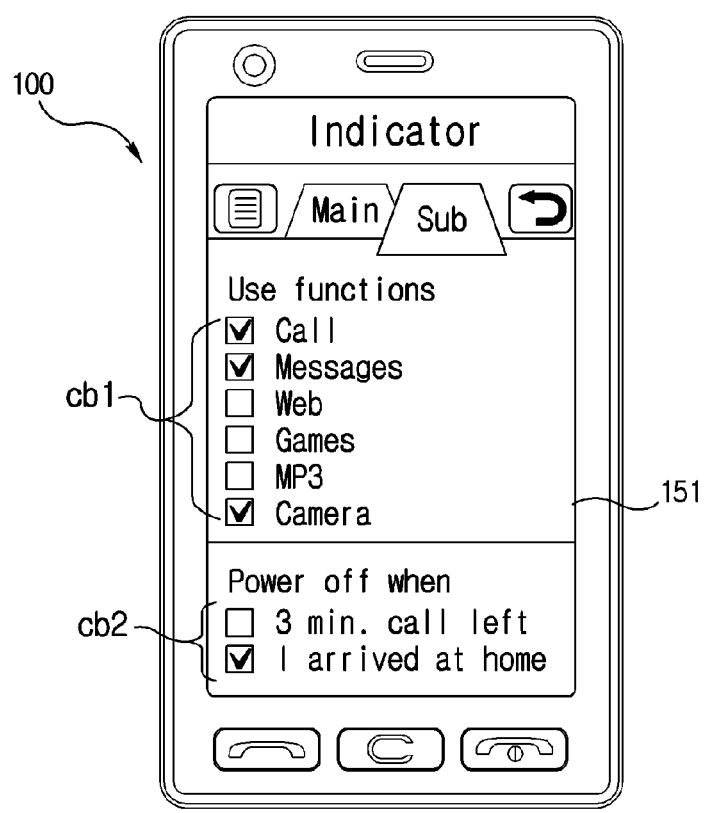
FIG. 13 illustrates a display screen for selecting functions that are activated and functions that are deactivated in an emergency mode among various functions that are performable by a mobile terminal.

FIG. 13 illustrates a display screen for selecting, among various functions that may be performed by the mobile terminal, specifically functions that are activated (e.g., functions that may be performed) and functions that are deactivated (e.g., functions that may not be performed) when the mobile terminal is operating under an emergency mode.

The controller of the illustrated mobile terminal (100) may output a mode function set-up screen for selecting functions to be activated in the emergency mode. The user may select check boxes (cb1) on the illustrated mode function set-up screen to designate functions to be activated or deactivated in the emergency mode. The user may also select other check boxes (cb2) to set up conditions for autonomously converting the mobile terminal to a waiting state (display off-state) or a power-off state. For example, if 'arrived at home' is checked (see FIG. 13), and if the mobile terminal is moved such it is located at "home," the mobile terminal operating in the emergency mode (e.g., a mobile terminal using a sub battery) may be turned off.

FIG. 13 illustrates a case where using a main battery is designated as a normal mode and using a sub battery is designated as emergency mode. In some other exemplary implementations, other mode designating methods may be used. For example, the normal mode and the emergency mode may be designated based on a total charge level of the batteries regardless of a main battery or a sub battery.

A mobile terminal (100) according to the second exemplary embodiment includes (e.g., is mounted with) at least two batteries, and inter-charging between the at least two batteries can be performed using a display and a user input unit.

The mobile terminal according to the second exemplary embodiment may include: first and second batteries supplying a driving power to elements of the mobile terminal; an output unit displaying content to a user; a user input unit receiving a command from the user; and a controller informing the user of charge levels of the first and second batteries, and performing the inter-charging between the first and second batteries upon receiving the command from the user.

Figure 14:
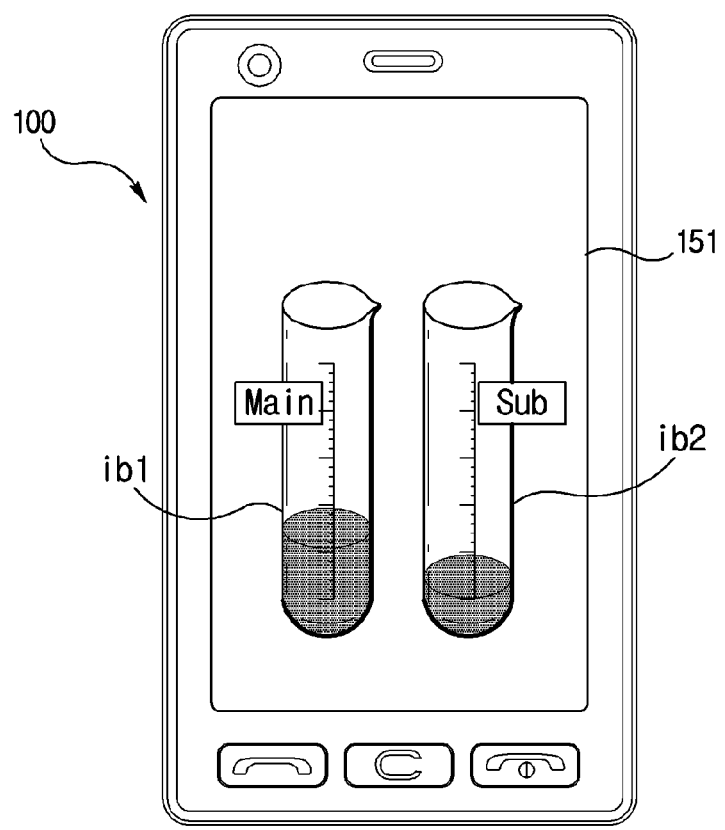
FIG. 14 illustrates a display screen indicating charged levels of two batteries using a representation of level of liquid contained in a vessel.

FIG. 14 illustrates a display screen indicating charged levels of first and second batteries using a graphical representation of a water level of liquid contained in a vessel.

A controller of the mobile terminal (100) may display a water level in an icon (ib1) of one vessel on the display screen according to the charged level of the second battery, and display a water level of an icon (ib2) of another vessel on the display screen according to the charged level of the first battery.

Figure 15:
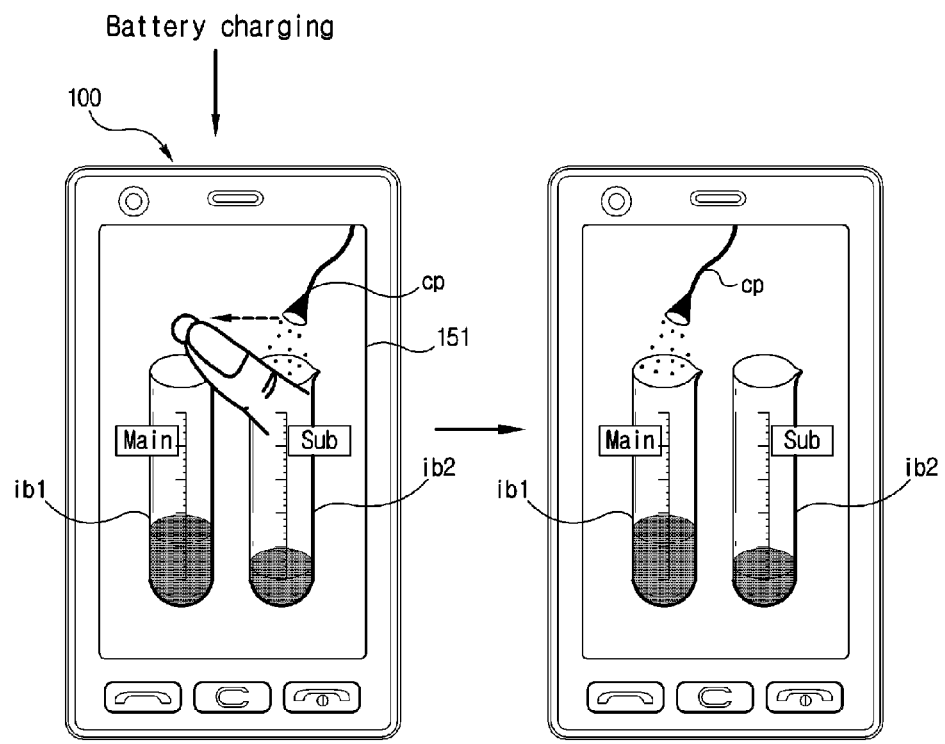
FIG. 15 illustrates a display screen designating a battery to be charged on a priority basis among two batteries.

FIG. 15 illustrates a display screen designating a battery to be charged on a priority basis by a user applying a touch-drag input on a screen displaying a vessel.

A display screen displays two vessel icons (ib1, ib2) and a pointer icon (cp) indicating a battery that is being charged. The user may move the pointer icon (cp) using the touch-drag method to designate a battery to be charged on the priority basis (e.g., with priority over the other battery). In the figure, although a first battery (e.g., the main battery) is selected to be charged first by default, a second battery (e.g., the sub battery) may be selected for charging using the pointer icon (cp).

A controller of the mobile terminal (100) may move the pointer icon (cp) selecting a battery to be charged first according to the user's touch-drag input, and perform a priority charging of the battery corresponding to the position of the pointer icon (cp).

Figure 16:
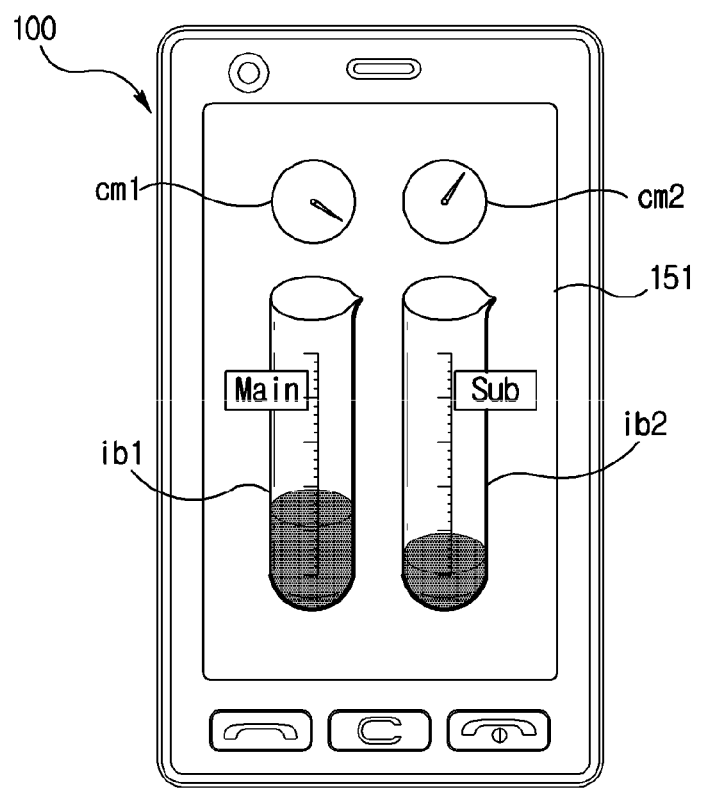
FIG. 16 illustrates a display screen indicating charged levels of two first batteries using a representation of level of liquid contained in a vessel and a position of a needle of a meter.

FIG. 16 illustrates a display screen indicating the charged levels of the first and second batteries using graphical representations of water levels of liquid contained in vessels (ib1, ib2) and positions of needles on meters (cm1, cm2).

A controller of the mobile terminal (100) may indicate a water level of an icon (ib1) in one vessel on the display screen and a needle position of one meter (cm1) according to a charged level of the second battery (e.g., the main battery), and may indicate a water level of an icon (ib2) in another vessel and a needle position of another meter (cm2) according to a charged level of the first battery (e.g., the sub battery).

Figure 17:
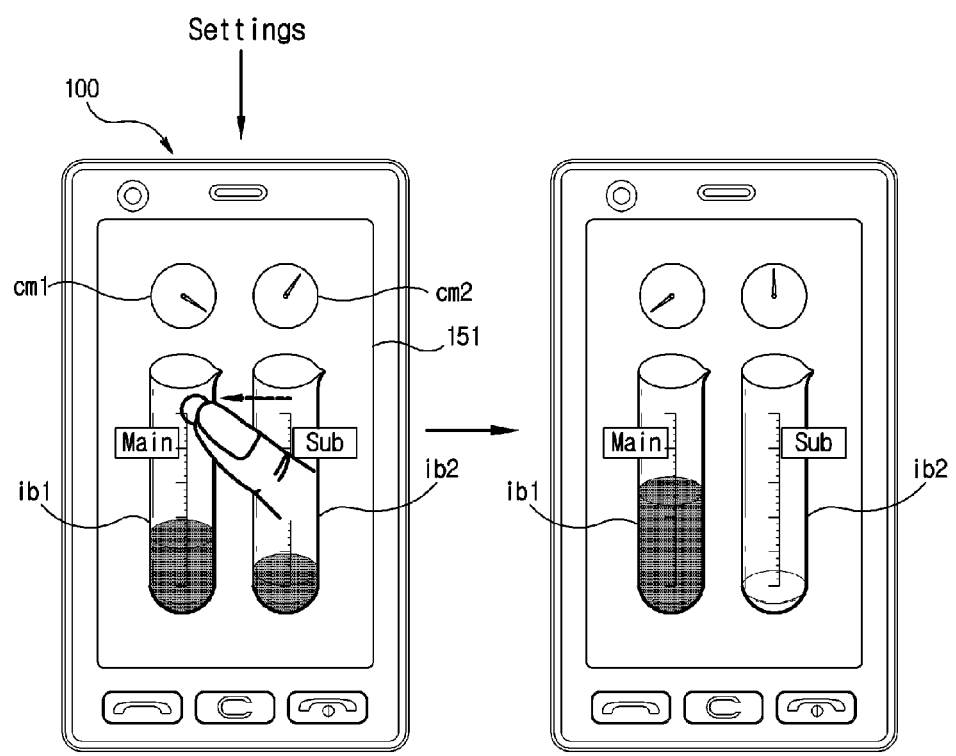
FIGS. 17, 18 and 19 illustrate a display screen showing an inter-charging between two batteries.
Figure 18:
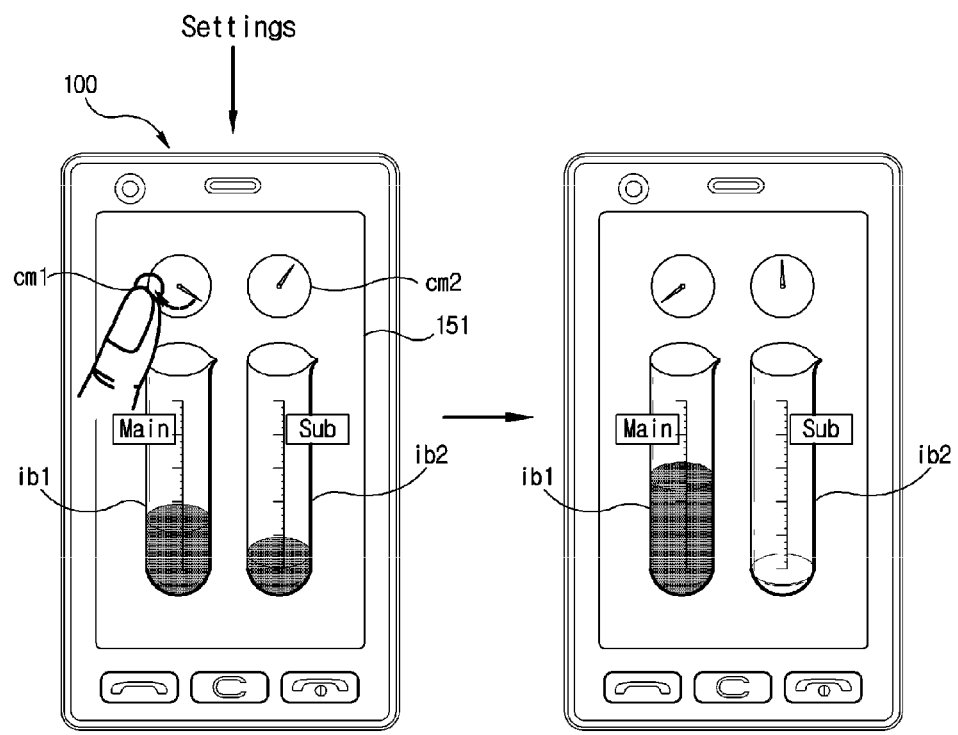
Figure 19:
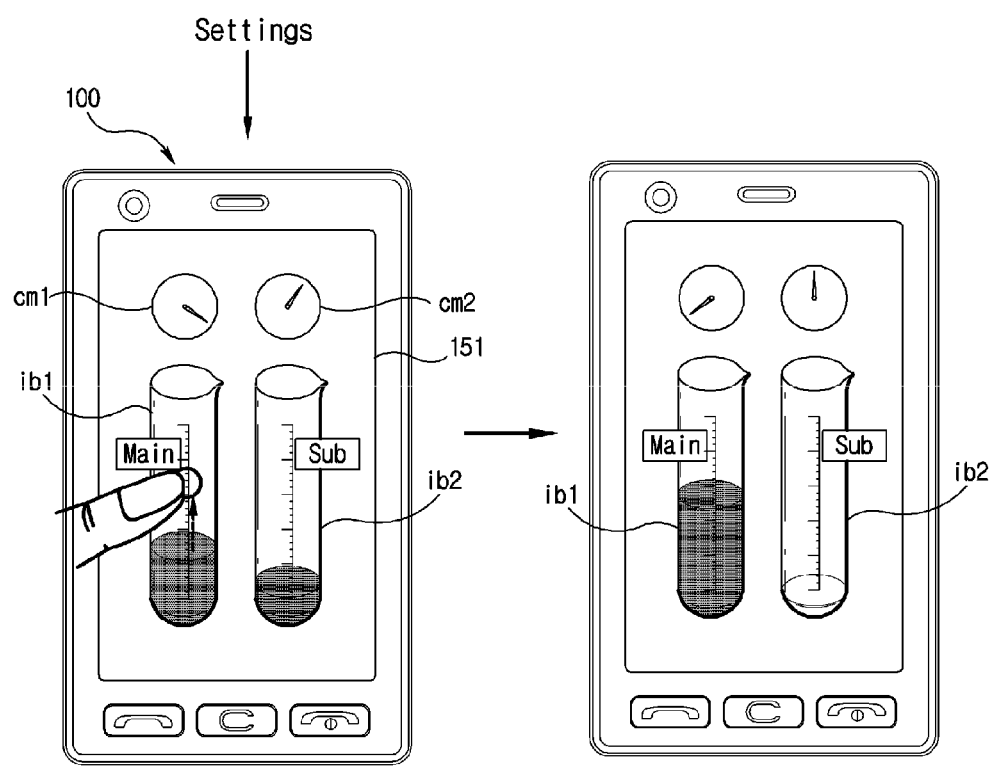

FIGS. 17 to 19 illustrate a display screen illustrating an inter-charging between two batteries performed in response to a touch-drag input applied to a screen displaying a vessel or a meter according to a user's selection.

Referring to FIG. 17, when the user touches the vessel icon (ib2) in the first battery and drags the vessel icon (ib2) toward the vessel icon (ib1) of the second battery, the second battery is charged by the power charged (or stored) in the first battery.

A controller of the mobile terminal (100) may perform an inter-charging between the first and second batteries in accordance with the touch-drag input applied by the user to the vessel icons (ib2, ib1) of the first and second batteries.

Referring to FIG. 18, when a touch-drag is executed to turn the needle of meter icon (cm1) of the second battery in a clockwise direction, the second battery may be charged with the stored power of the first battery. Conversely, when a touch-drag is executed to turn the needle of meter icon (cm2) of the first battery in a clockwise direction, the first battery may be charged by the stored power of the second battery.

A controller of the mobile terminal (100) may perform an inter-charging between the first and second batteries in accordance with the touch-drag input applied by the user to the needle of meter icon (cm1, cm2) of the first and second batteries.

Referring to FIG. 19, when a touch-drag is executed in a direction to increase the water level of a vessel icon (ib1) of the second battery, the second battery may be charged using the stored power of the first battery. Conversely, when a touch-drag is executed in a direction to increase the water level of the vessel icon (ib2) of the first battery, the first battery may be charged with the stored power of the second battery.

A controller of the mobile terminal (100) may perform an inter-charging between the first and second batteries in accordance with the touch-drag input applied by the user to the vessel icons (ib2, ib1) of the first and second batteries.

Figure 20:
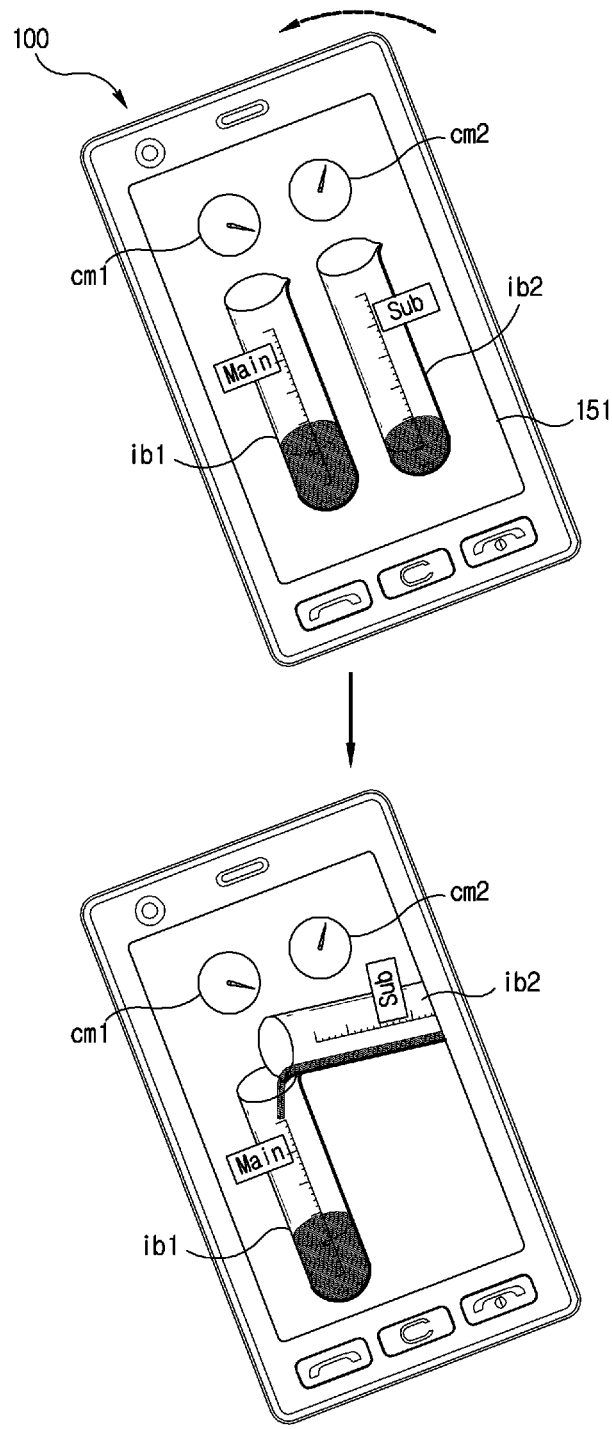
FIG. 20 illustrates a display screen showing an inter-charging between two batteries according to a motion applied to a mobile terminal.

FIG. 20 illustrates a display screen illustrating an inter-charging between two batteries according to a motion applied to a mobile terminal according to a user's selection.

Referring to FIG. 20, when the user inclines the mobile terminal to the left hand side (e.g., tilts the mobile terminal toward the left), the second battery having a lower position relative to the gravitational direction may be charged using the stored power of the first battery having a higher position relative to the gravitational direction.

The mobile terminal (100) may include a motion sensor for detecting movement of the mobile terminal, and a controller of the mobile terminal may perform an inter-charging between the first and second batteries in response to the inclination (detected by the motion sensor) of the mobile terminal that displays graphical representations of the first and second batteries.

Figure 21:
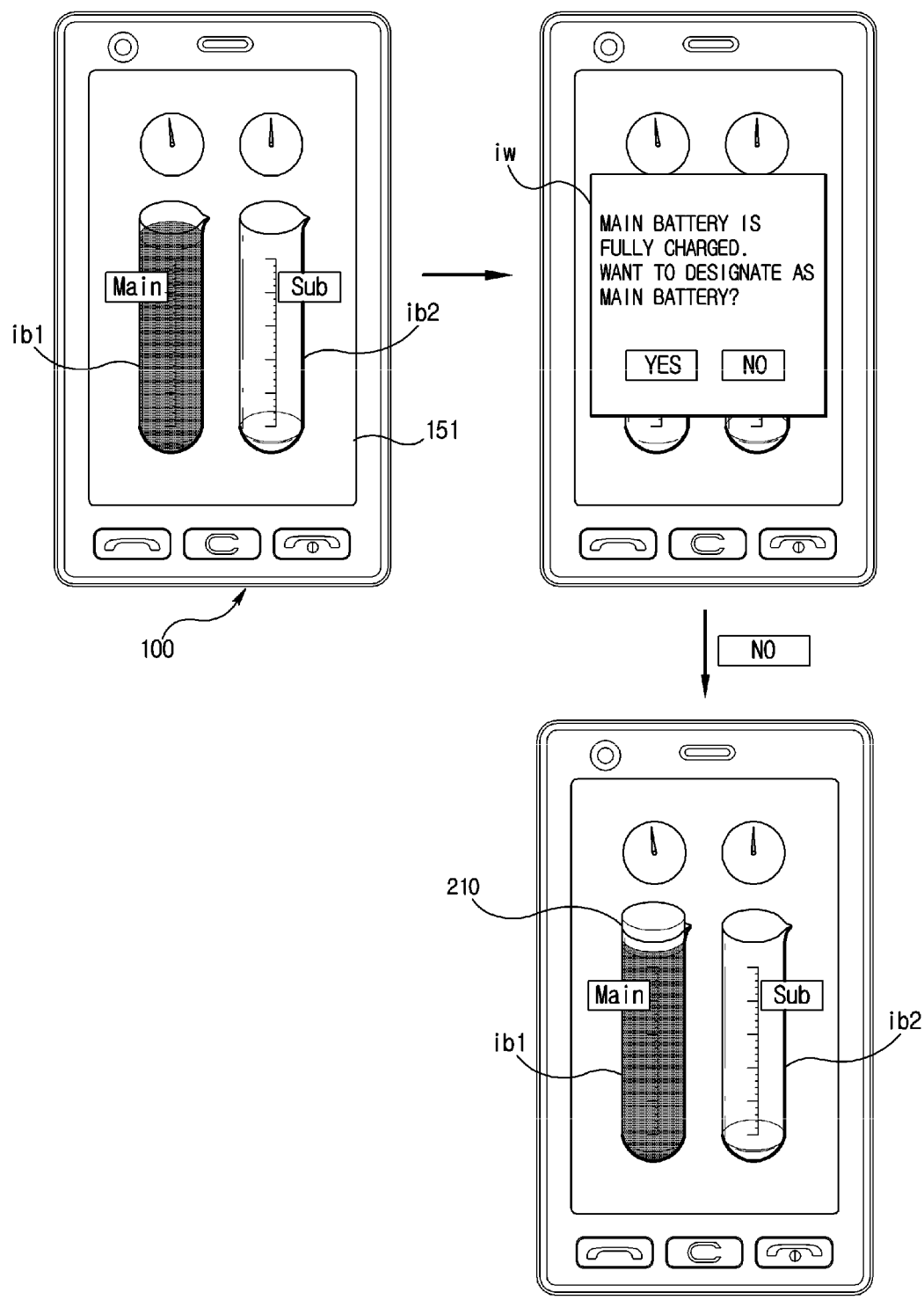
FIG. 21 illustrates a display screen showing necessary actions to be taken when one of two batteries is completely charged.

FIG. 21 illustrates a display screen showing necessary actions to be taken when the charging of one of two batteries is completed.

Referring to FIG. 21, once the charging of the second battery is completed, a controller of the mobile terminal (100) notifies the user of the completion of the charging of the second battery, and displays a window (iw) inquiring which battery is to be designated as a main battery. If the user touch-inputs NO to the inquiry, the first battery may be designated as a main battery, while the second battery may be kept as a sub battery. Referring to FIG. 21, keeping the second battery as a sub battery is indicated by a corresponding icon (ib1) of a vessel closed by a lid 210.

Figure 22:
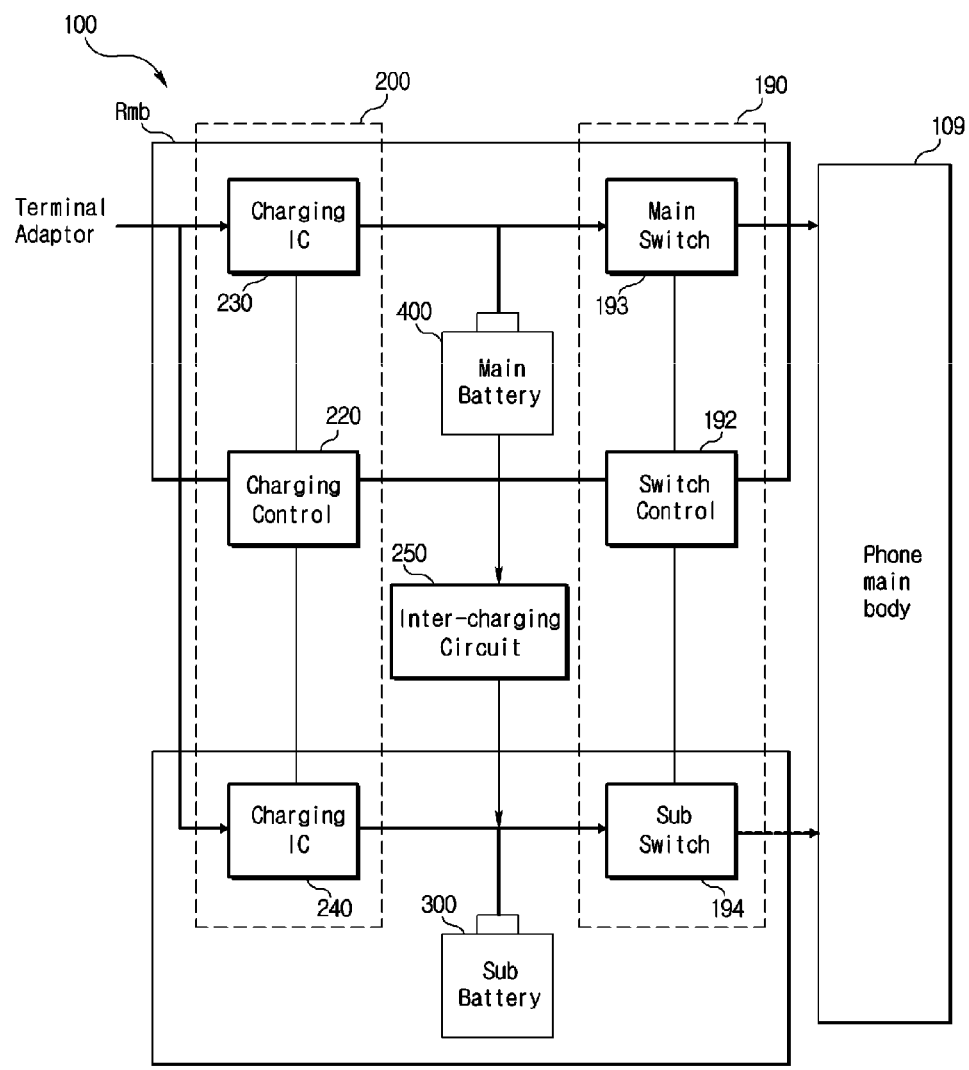
FIG. 22 illustrates a block diagram of a configuration of a mobile terminal having two batteries, that is capable of performing a support for charges between the two batteries.

FIG. 22 illustrates a block diagram illustrating a configuration of a mobile terminal (100) having two batteries, and capable of supporting an inter-charging between the first battery as a sub battery and the second battery as a main battery.

The mobile terminal (100) may include: a main battery (400) supplying a driving power to a body (109) of the mobile terminal; a sub battery (300) supplying a driving power to parts of the mobile terminal if a charged level of the main battery (400) is insufficient; a power supply unit ((190)) supplying power from the main battery (400) and/or the sub battery (300) to the body; a charger (200) charging the main battery (400) and/or the sub battery (300) using power from an external power source; and an inter-charging circuit (250) charging the sub battery using a residual charged power of the main battery (400). The inter-charging circuit (250) may be a step-up circuit that charges the sub battery (300) by increasing a voltage of power discharged from the main battery (400).

A mobile terminal (100) according to the third exemplary embodiment includes: a battery supplying driving power to parts of the mobile terminal; a display displaying an inner state (e.g., operating state) of the mobile terminal to a user; and a controller notifying the user of a long time power consumption of the mobile terminal The mobile terminal according to the third embodiment may not limit the number of batteries, such that features of the mobile terminal according to the first and second exemplary embodiments may also be applied in the third exemplary embodiment.

Figure 23A:
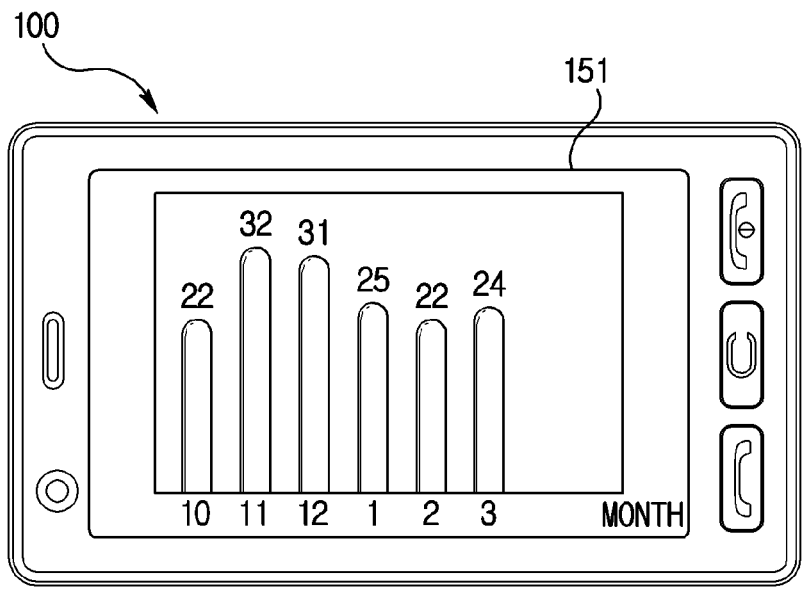
FIGS. 23a and 23b illustrate a display screen indicating a status of long time power use by a mobile terminal.
Figure 23B:
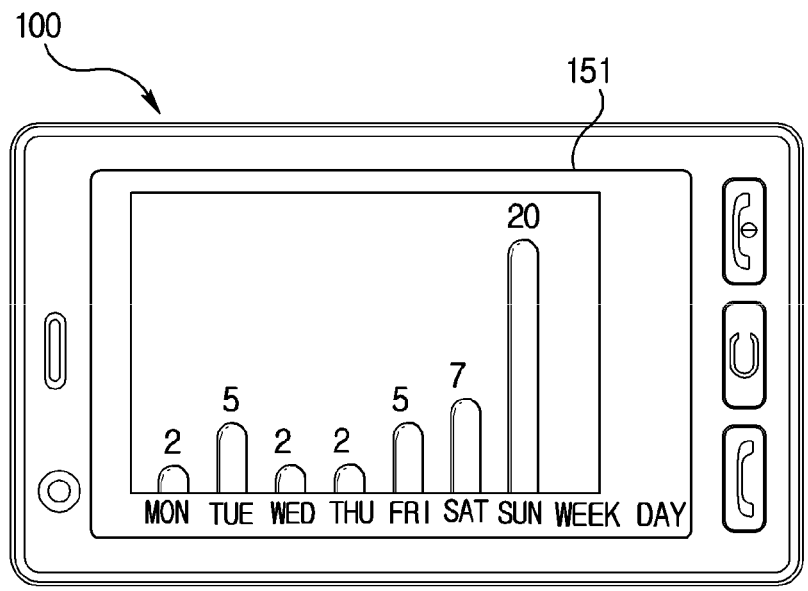
Figure 24:
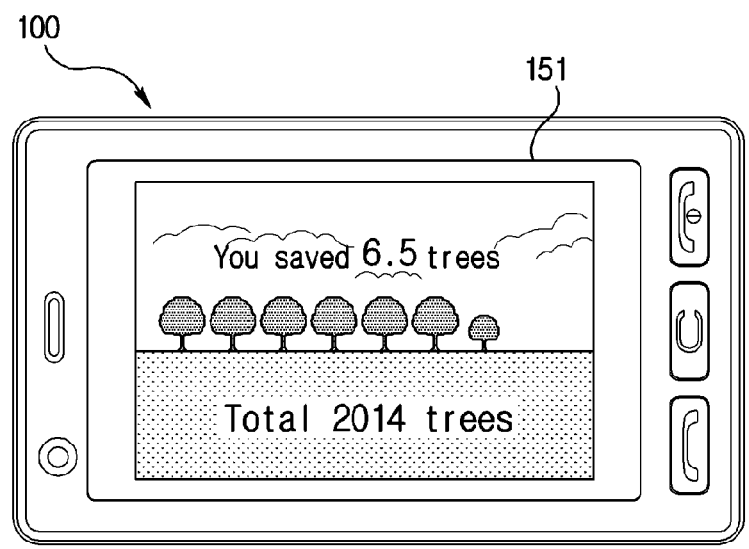
FIG. 24 illustrates a display screen indicating an effect generated by a long time power use by a mobile terminal.

FIGS. 23a and 23b illustrate a display screen showing a power consumption status of the mobile terminal (100) over a certain period of time, and FIG. 24 illustrates a display screen showing an effect caused by a power consumption of the mobile terminal (e.g., by a reduction in power consumption) over the time period.

A controller of the mobile terminal (100) may display monthly power consumption in graphical form as shown in FIG. 23a, or display daily power consumption in graphical form as shown in FIG. 23b. The power consumption may be obtained by determining an amount of power discharged by the mobile terminal.

The controller of the mobile terminal (100) may display an effect caused by an increase or a decrease of power consumption in the recent period (e.g., month, week) over that of the previous period. For example, when the power consumption of the recent period has decreased, as shown in FIG. 24, the display displays the number of trees that would have been necessary for offsetting an amount of carbon dioxide corresponding to the difference in power consumption.

A mobile terminal (100) mounted with a plurality of batteries having additional functions will now be described with reference to various embodiments.

The mobile terminal (100) illustrated in FIG. 2 may include: a first battery supplying a driving power to a body of the mobile terminal (hereinafter referred to as a body) including elements of the mobile terminal; and a second battery supplying driving power to the body that is detachable from the mobile terminal under a normal use (e.g., a nominal operation) of the mobile terminal by a user (hereinafter referred to as a user).

A configuration of the first and second batteries may be one of the following examples.

First, a first battery of a relatively small charging capacity and a second battery of a large charging capacity may be combined. The first battery of a small capacity may be built in the mobile terminal so as not to be separated from the mobile terminal under a normal user by the user.

In a second configuration, the mobile terminal (100) may have a two-battery combination unit, where each of the two batteries may have a similar charging capacity and size, and may be fastened to any place (or portion) of the combination unit. The mobile terminal may be driven if at least one charged battery is fastened to the two-battery combination unit.

In a third configuration, when the mobile terminal (100) is fastened only to the first battery, the mobile terminal may be used in a first portable configuration, and when the mobile terminal is fastened with the first and second batteries, the mobile terminal may be used in a second portable configuration.

The advantage is that the first portable configuration can provide the user with a portability in which the mobile terminal (100) is reduced in overall size, while the second portable configuration can provide the user with a larger-capacity power supply unit.

The mobile terminal (100) of FIG. 2 may have a charging structure according to a charging strategy of two fastened batteries. Alternatively, the mobile terminal of FIG. 2 may have various power supply unit structures according to a charging strategy of receiving power from the fastened two batteries.

Figure 25:
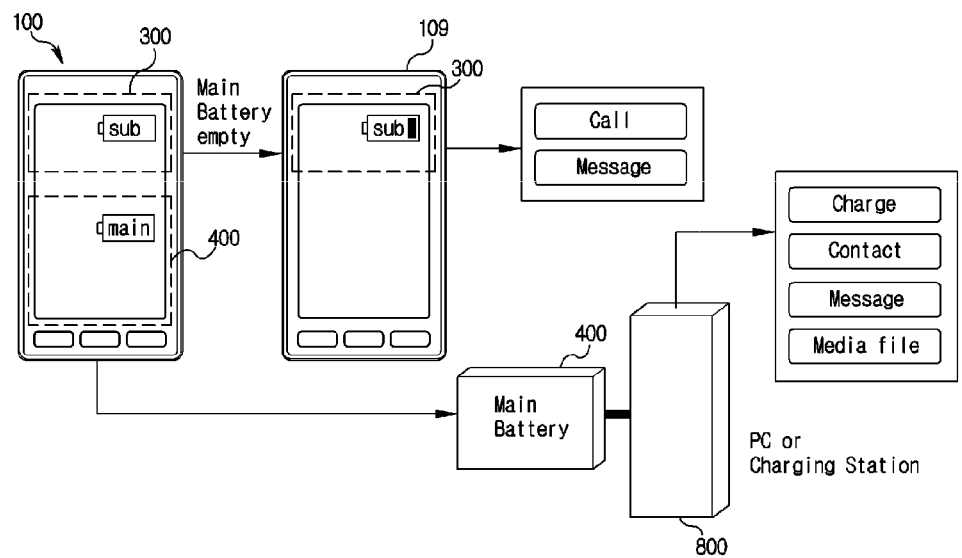
FIG. 25 illustrates a mobile terminal according to an exemplary embodiment.

FIG. 25 illustrates a mobile terminal (100) according to a fourth exemplary embodiment.

The mobile terminal (100) according to the fourth exemplary embodiment may include: a sub battery (300) as a first battery supplying driving power to a body (109) of the mobile terminal including parts of the mobile terminal; and a main battery (400) as a second battery supplying the driving power to the parts of the mobile terminal mounted on the body (109) by being fastened along with the sub battery (300) or provided independently from the body (109), and having additional functions apart from a function of supplying the driving power.

Referring to FIG. 25, if the main battery (400) is discharged, the main battery may be separated from the body (109) to be charged through a separate charging station (800). However, even if the main battery is separated from the body (109), the body is fastened to the sub battery (300) to allow the mobile terminal to maintain the function(s) of the mobile terminal using the sub battery (300).

When using the sub battery (300) (which may have a small capacity), performance of various multimedia functions of the mobile terminal may be withheld (e.g., preempted). Referring to FIG. 25, when the mobile terminal (100) fastened only with the sub battery (300), only message and communication functions may be performed. When the body (109) is fastened with the sub battery (300), the mobile terminal is operated not under a normal mode, but under a power save mode.

A controller (180) mounted on the body (109) of the mobile terminal (100) may deactivate additional functions other than the audio call function and the message transmission function, when the body (109) is coupled with the sub battery (300), and the main battery (400) is separated from the body.

The main battery (400) that is separated from the body (109) may perform one or more functions among various additional functions. The various additional functions may be conducted by the separated main battery itself, or by a combination of the separated main battery (400) and the charging station (800). In FIG. 25, the additional functions that are provided by the combination of the charging station (800) include a contact search, a multimedia file reproduction, and a message transmission.

The main battery (400) may further include means for conducting the illustrated additional functions. In some exemplary embodiments, the additional functions may be conducted by the main battery (400) or by the charging station (800).

The main battery (400) may include a processor for conducting the additional functions (e.g., contact search, multimedia file reproduction, or message transmission), and storage for storing data necessary for the processor to conduct the additional functions.

The charging station (800) may be provided with the processor for conducting the additional functions (e.g., contact search, multimedia file reproduction, or message transmission) at the charging station (800), and the main battery (400) may be provided with storage for storing data necessary for the charging station (800) to conduct the additional functions. For example, the main battery (400) may be provided with a non-volatile memory for storing multimedia files for reproduction of multimedia files.

Figure 26:
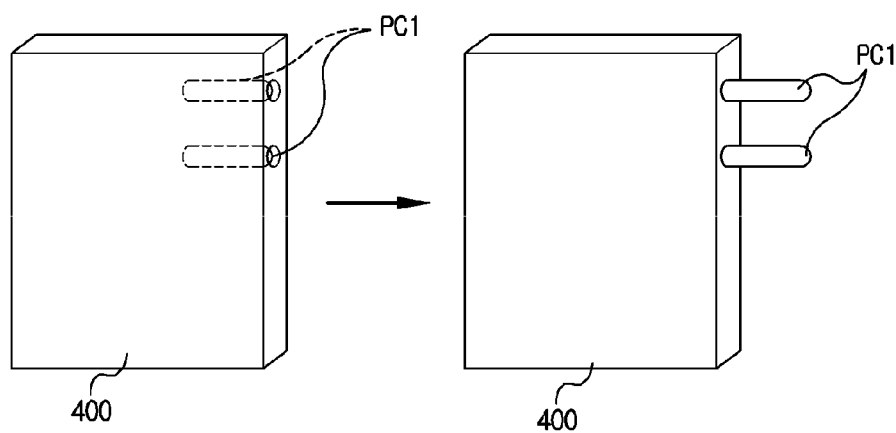
FIG. 26 is a perspective view illustrating a main battery according to an exemplary embodiment.

FIG. 26 is a perspective view illustrating a main battery (400) according to another exemplary embodiment.

The main battery (400) may include plug means (PC1) pluggable to an outlet, and a charging circuit (not shown) charging the main battery using a power source from the plug means (PC1).

The plug means (PC1) may be implemented by a plug socket that is positioned at an inner volume of the main battery (400) in a nominal configuration, but extendable to protrude out from the main battery (400) for charging the main battery (400). Providing an inner volume in the main battery (400) for storing the plug socket and allowing the plug socket to slidably move inside the inner volume is known by those of ordinary skill in the art. Therefore, further detailed explanation regarding such an implementation will not be provided.

Figure 27:
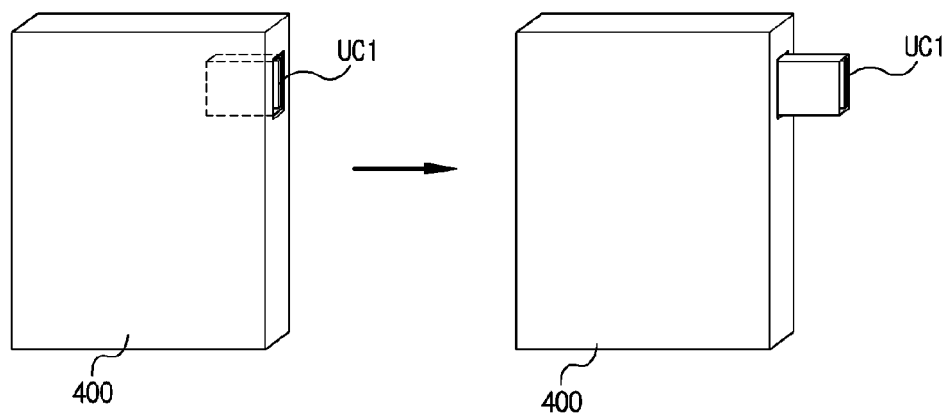
FIG. 27 is a perspective view illustrating a main battery according to another exemplary embodiment.

FIG. 27 is a perspective view illustrating a main battery (400) according to still another exemplary embodiment.

The main battery (400) may include a USB (Universal Serial Bus) combining means (UC1) that can be coupled to a USB port of an external device, and a charging circuit (not shown) charging the main battery (400) using a power source from the USB combining means (UC1).

The USB combining means (UC1) may be implemented by a USB terminal that is positioned at an inner volume of the main battery (400) in a nominal configuration, but extendable to protrude out from the main battery (400) for charging the main battery (400). Providing an inner volume in the main battery (400) for storing the USB terminal and allowing the USB terminal to slidably move inside the inner volume is known by those of ordinary skill in the art. Therefore, further detailed explanation regarding such an implementation will not be provided.

Figure 28A:
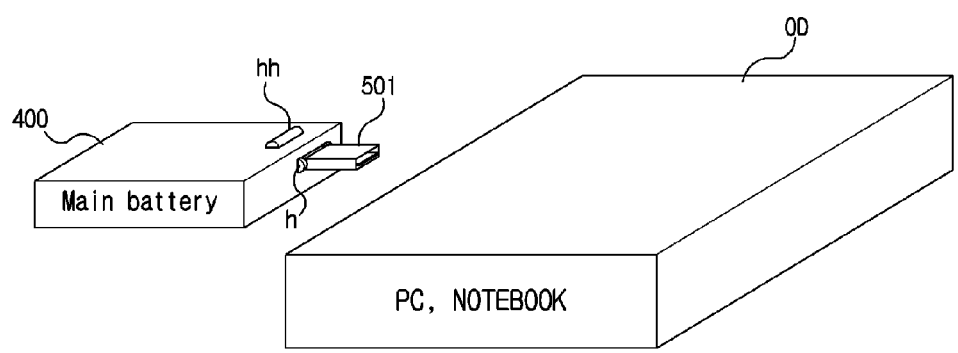
FIGS. 28a and 28b are perspective views illustrating a main battery according to still another exemplary embodiment.
Figure 28B:
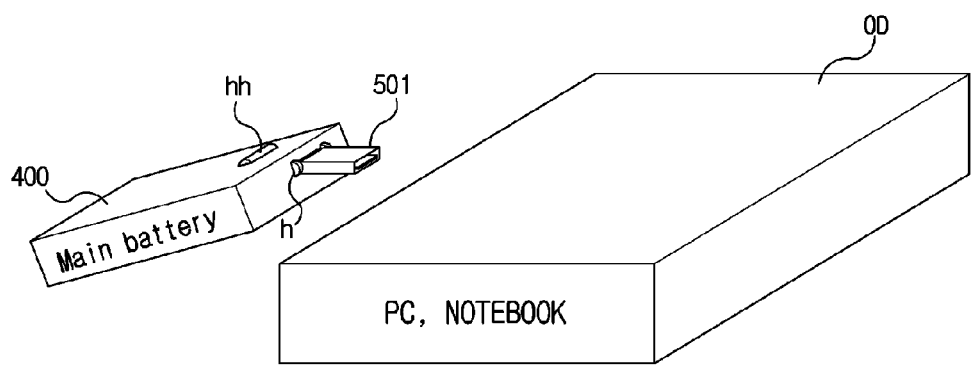

FIGS. 28a and 28b are perspective views illustrating a main battery (400) in which a USB combining means is embedded in a rotatable manner according to still another exemplary embodiment.

The USB combining means may include a USB socket (501) mechanically coupled to a USB port of an external device (OD) and rotatable with respect to its combining direction; a hinge (h) connected to the main battery (400) for the USB socket (501) to rotate within, and a handle (hh) that is changeable in its combining direction of the USB socket (501) according to a user manipulation.

Figure 29:
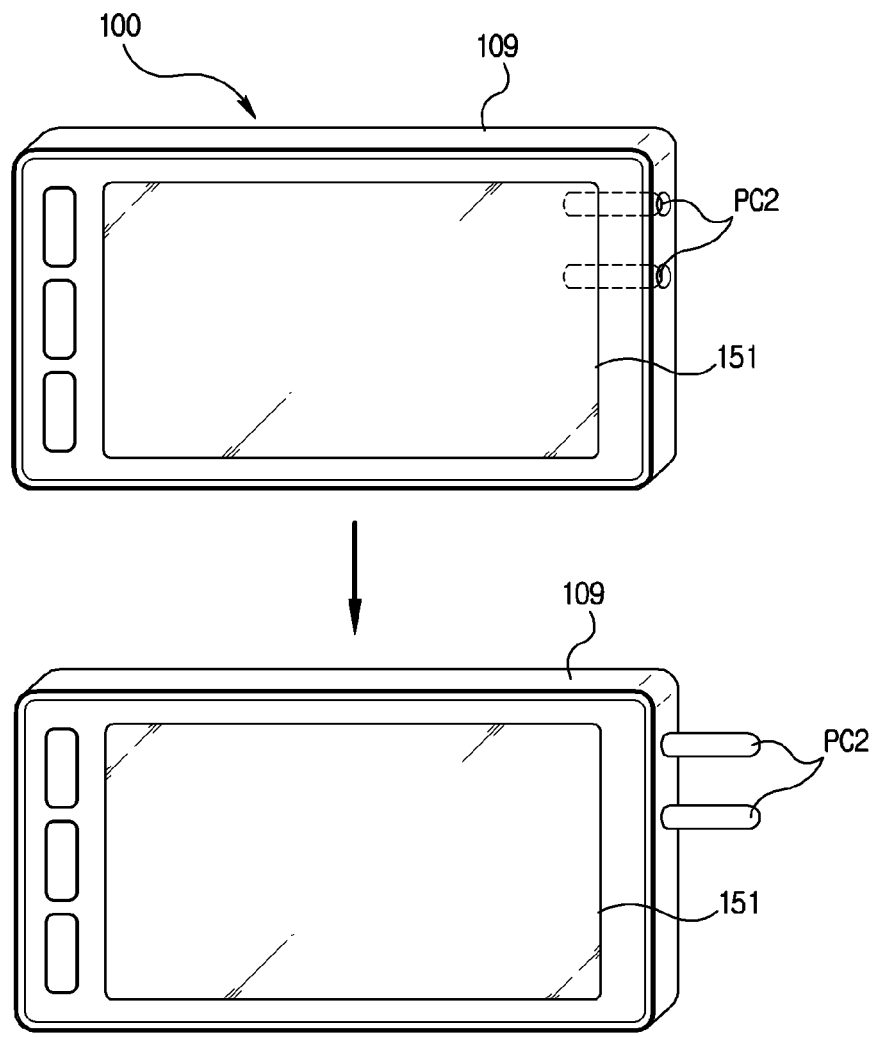
FIG. 29 is a perspective view illustrating a body of a mobile terminal according to still another exemplary embodiment.

FIG. 29 is a perspective view illustrating a body (109) of a mobile terminal (100) according to still another exemplary embodiment.

The body (109) may include plug means (PC2) for connection to an outlet, and a charging circuit (not shown) charging batteries (a main battery and/or a sub battery) coupled to the body (109) using a power source from the plug means (PC2).

The plug means (PC2) may be implemented by a plug socket that is positioned at an inner volume of the body (109) in a nominal configuration, but extendable to protrude out from the body (109) for charging the main and sub batteries. Providing an inner volume in the body (109) of the body (109) for storing the plug socket and allowing the plug socket to slidably move inside the inner volume is known by those of ordinary skill in the art. Therefore, further detailed explanation regarding such an implementation will not be provided.

Figure 30:
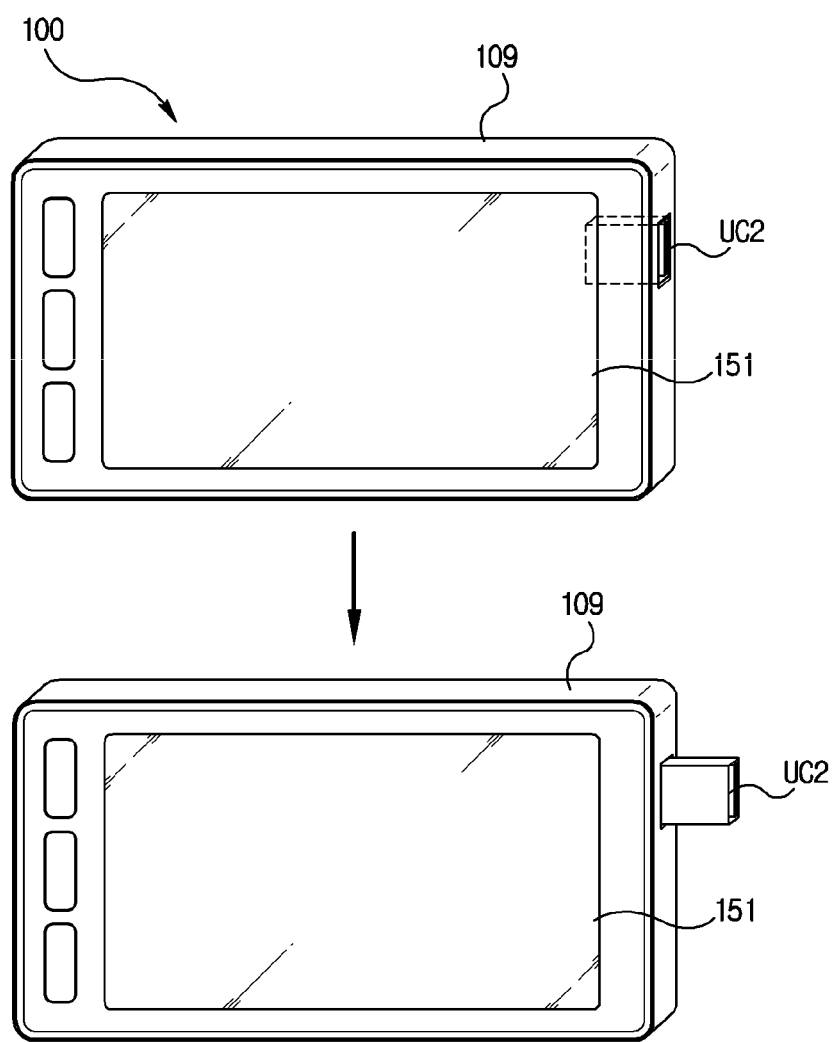
FIG. 30 is a perspective view illustrating a body of a mobile terminal according to still another exemplary embodiment.

FIG. 30 is a perspective view illustrating a body of a mobile terminal (100) according to still another exemplary embodiment.

A body (109) of the mobile terminal (100) illustrated in FIG. 30 may include a USB (Universal Serial Bus) combining means (UC2) that can be coupled to a USB port of an external device, and a charging circuit (not shown) charging batteries (a main battery and/or a sub battery) using a power source from the USB combining means (UC2).

The USB combining means (UC2) may be implemented by a USB terminal that is positioned at an inner volume of the body (109) of the main battery (400) in a nominal configuration, but extendable to protrude out from the body (109) for charging the batteries. Providing an inner volume in the body (109) for storing the USB terminal and allowing the USB terminal to slidably move inside the inner volume is known by those of ordinary skill in the art. Therefore, further detailed explanation regarding such an implementation will not be provided.

Figure 31A:
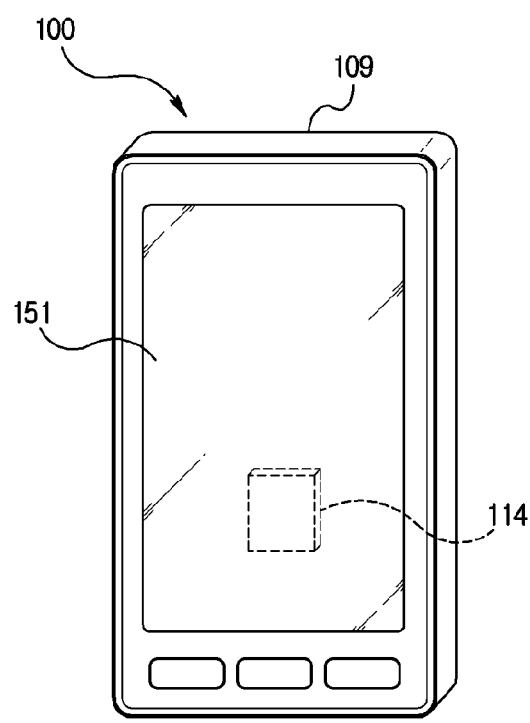
FIGS. 31a and 31b are perspective views illustrating a body and a main battery of a mobile terminal according to still another exemplary embodiment.
Figure 31B:
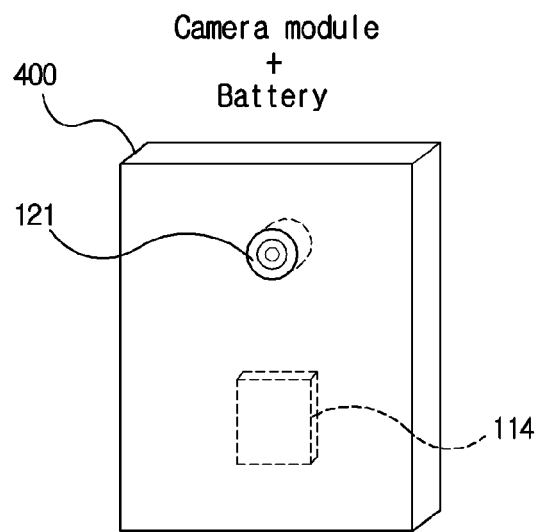

FIGS. 31a and 31b are perspective views illustrating a body (109) and a main battery (400) of a mobile terminal (100) according to still another exemplary embodiment, where photographing (particularly self-photographing) is facilitated using the body and the main battery.

The body (109) according to FIG. 31a may include a display (151) displaying photographed image or a preview image, a user input unit (e.g., the user input unit (130)) receiving a photograph command from a user, and a short-range communication module (114) transmitting a wireless signal to the main battery (400).

The main battery (400) illustrated in FIG. 31b may include a camera (121) for obtaining an image, a short-range communication module (114) wirelessly receiving a photograph command from the short-range communication module (114) of the body (109), and a processor (not shown) operating the camera (121) in response to the received photograph command.

The processor may transmit to the body (109) the image photographed by the camera module (121) or a preview image via the short-range communication module (114). The display (151) may display the transmitted photographed image or the preview image.

A user may check the preview image of the camera (121) via the display (151) by positioning the main battery (400) to allow the camera (121) to face an object.

If the preview image is a suitable image for photographing, the user may press a manipulation button defining a shutter of the user input unit of the body (109) in the mobile terminal (100). If the manipulation button is depressed, the short-range communication module (114) of the body may transmit a wireless signal defining (or providing) a photograph command. The main battery (400) that has received the wireless signal from the short-range communication module (114) may activate the shutter of the camera (121) to obtain a still image.

Figure 32A:
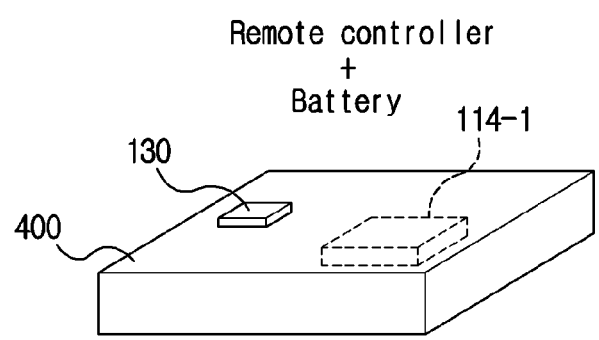
FIGS. 32a and 32b are perspective views illustrating a body and a main battery of a mobile terminal according to still another exemplary embodiment.
Figure 32B:
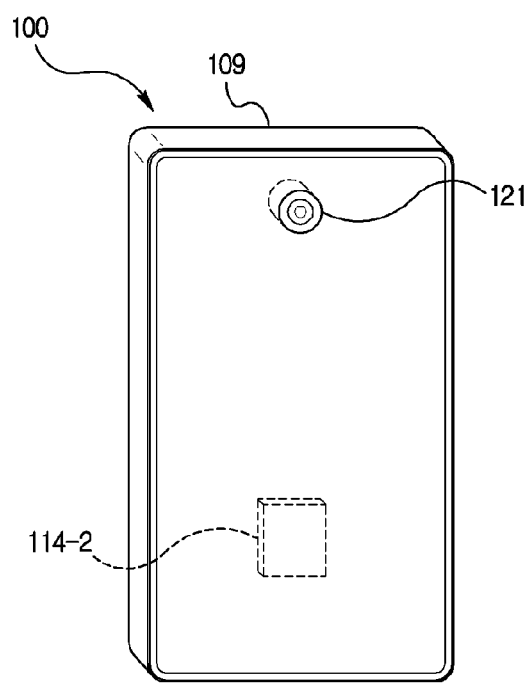

FIGS. 32a and 32b are perspective views illustrating a body (109) and a main battery (400) of a mobile terminal (100) according to still another exemplary embodiment, where the photographing (particularly self-photographing) is facilitated using the body and the main battery.

The main battery (400) illustrated in FIG. 32a may include a user input unit (130) receiving a photograph command from a user, and a short-range communication module (114-1) transmitting a wireless signal to the body (109) in the mobile terminal (100).

The body (109) illustrated in FIG. 32b may include a camera (121) for obtaining an image, a short-range communication module (114-2) wirelessly receiving a photograph command from the short-range communication module (114-1), and a controller (180) operating the camera (121) in response to the received photograph command.

The user may use the user input unit (130) of the main battery (400) by positioning the body (109) to allow the camera (121) to face an object. If the user input unit is depressed, the short-range communication module (114-1) may transmit a wireless signal defining (or providing) a photograph command. The controller that has received the wireless signal may activate the shutter of the camera (121) to obtain a still image.

Figure 33A:
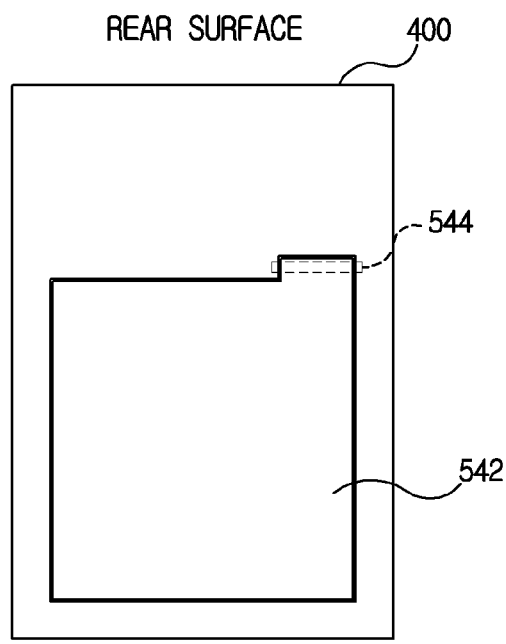
FIGS. 33a, 33b and 33c are schematic views illustrating a body and a main battery of a mobile terminal according to still another exemplary embodiment.
Figure 33B:
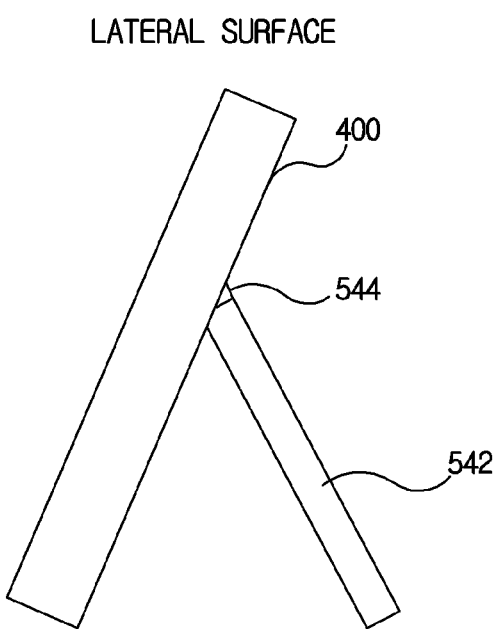

FIGS. 33a, 33b and 33b are schematic views illustrating a body (109) and a main battery (400) of a mobile terminal (100) according to still another exemplary embodiment.

The main battery (400) may include mounting means (542) for supporting a body of the mobile terminal (100) so that the body can be erected (or positioned) at a predetermined angle relative to a ground surface. The main battery (400) may be fastened in a manner such that the main battery can abut an entire surface (e.g., rear surface) of the mobile terminal opposite the display (151) of the mobile terminal and the entire mobile terminal can be supported in an erected state while the main battery is fastened to the body of mobile terminal. The mounting means (542) may be connected to the main battery (400) via a hinge (544) that abuts the main battery (400) when not being mounted.

Figure 34:
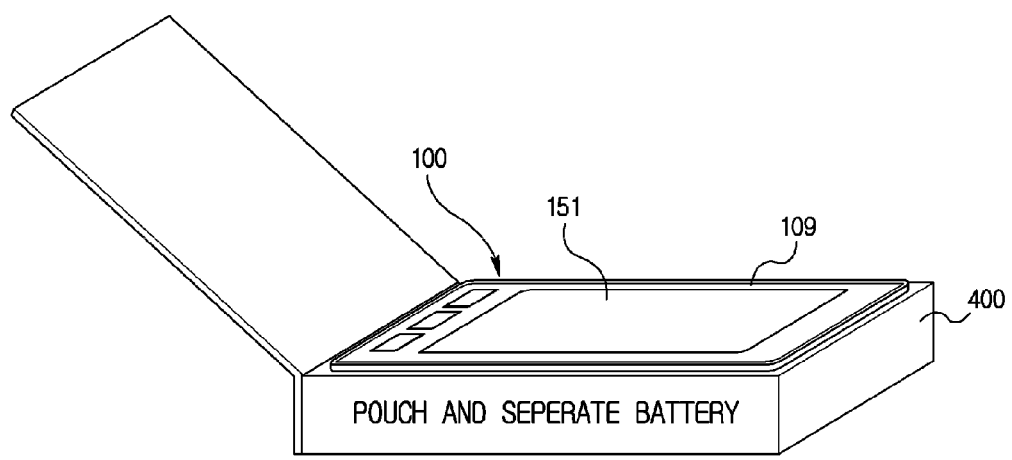
FIG. 34 is a perspective view illustrating a body and a main battery of a mobile terminal according to still another exemplary embodiment.

FIG. 34 is a perspective view illustrating a body and a main battery (400) of a mobile terminal (100) according to still another exemplary embodiment, in which the main battery (400) is disposed within a pouch structure capable of receiving the body (109) so that the body (109) of the mobile terminal (100) can be protected against an external physical shock.

When the body (109) is coupled to the main battery (400), the body (109) is embedded in the pouch structure to be protected against an external physical shock, as illustrated in FIG. 34.

Figure 35:
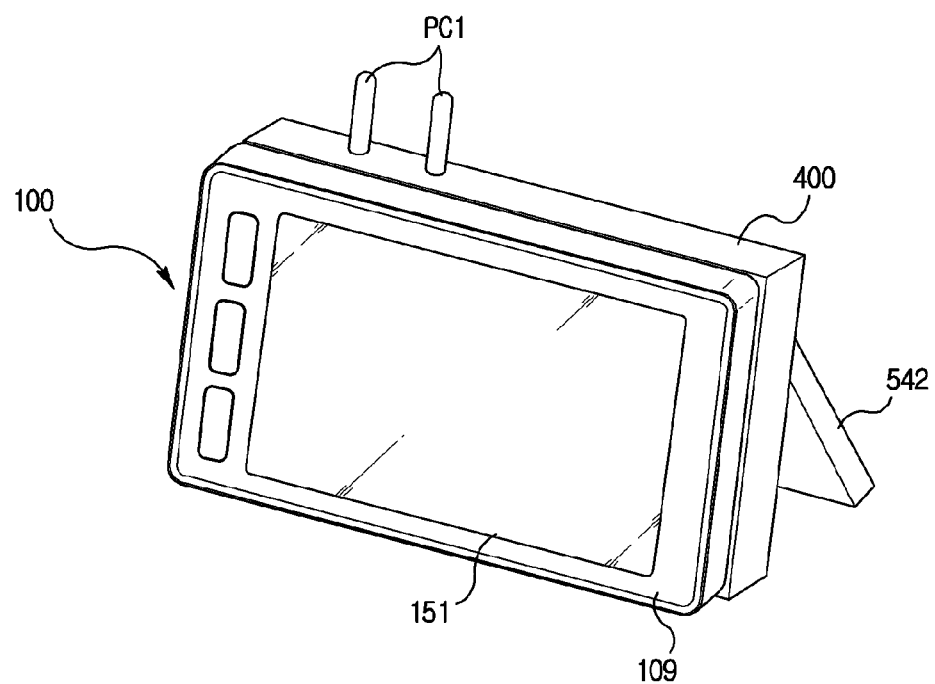
FIG. 35 is a perspective view illustrating a body and a main battery of a mobile terminal according to still another exemplary embodiment.

FIG. 35 is a perspective view illustrating a body (109) and a main battery (400) of a mobile terminal (100) according to still another exemplary embodiment.

Figure 33C:
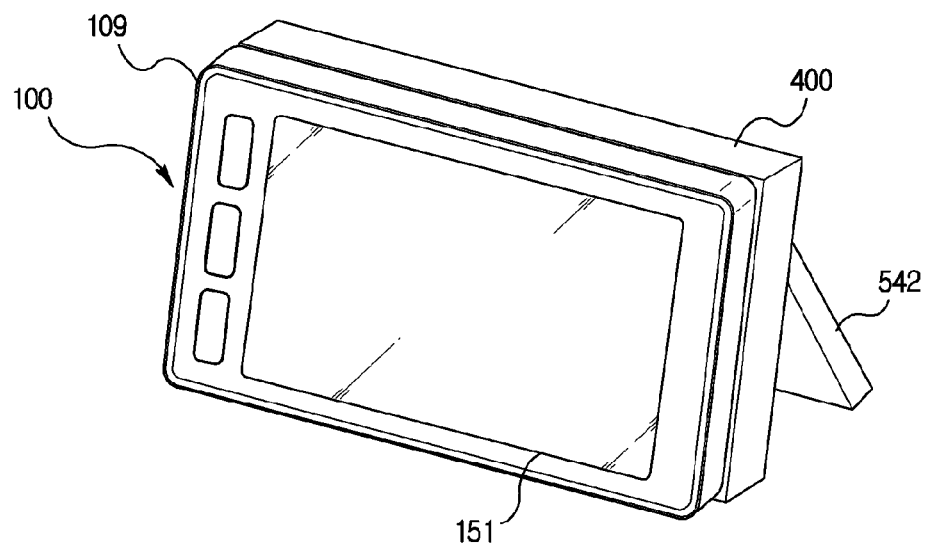

The main battery (400) may include mounting means (542) for supporting the body of the mobile terminal (100) as illustrated in FIGS. 33a to 33c, and main battery embedded/protruding plug means (PC1) as illustrated in FIG. 26. Further description regarding the mounting means (542) and the plug means (PC1) will not be provided as they have been already described earlier with reference to the noted figures.

Figure 36:
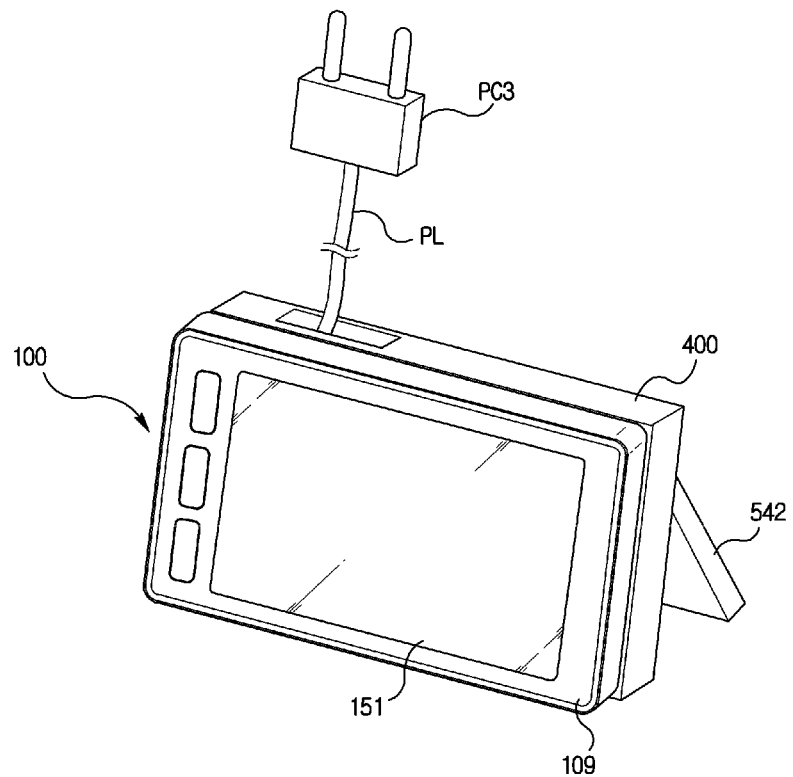
FIG. 36 is a perspective view illustrating a body and a main battery of a mobile terminal according to still another exemplary embodiment.

FIG. 36 is a perspective view illustrating a body (109) and a main battery (400) of a mobile terminal (100) according to still another exemplary embodiment, in which, in addition to the main battery structure illustrated in FIG. 35, a cord (PL) connected to a charging circuit in the main battery (400) and a plug socket (PC3) connected to the cord (PL) are illustrated. In comparison with FIG. 35, the main battery (400) of FIG. 36 may be less portable than the main battery illustrated in FIG. 35, but the main battery (400) of FIG. 36 may be more convenient to charge.

Figure 37A:
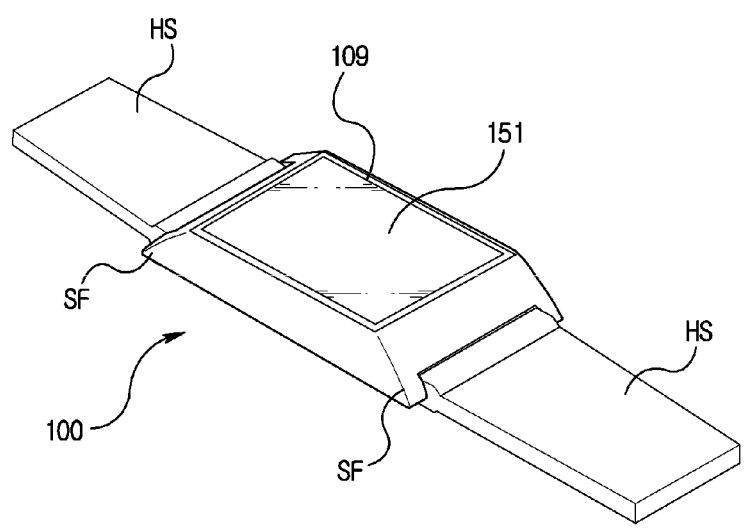
FIG. 37a is a perspective view illustrating a body of a mobile terminal according to still another exemplary embodiment.
Figure 37B:
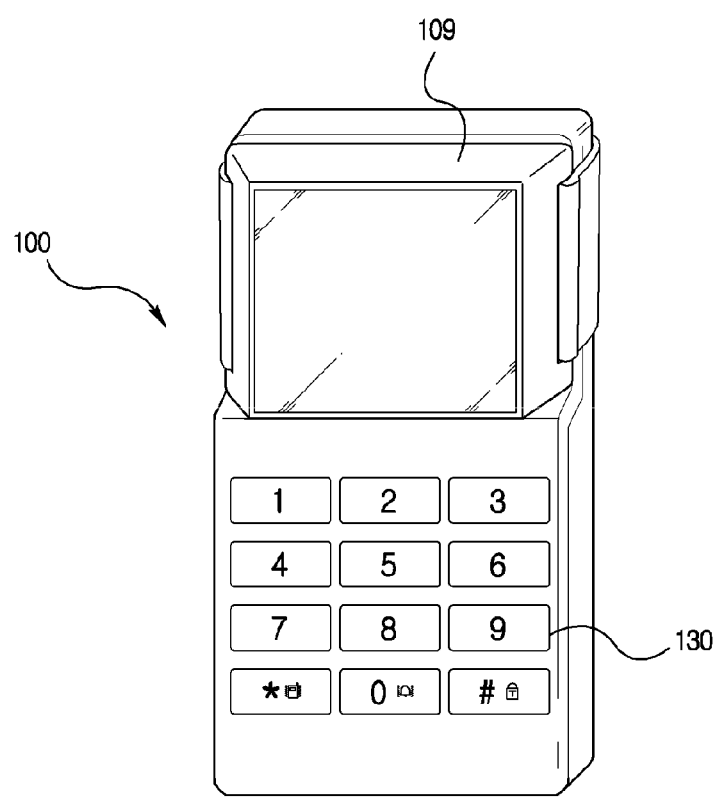
FIG. 37b is a perspective view illustrating a configuration in which a body and a main battery of a mobile terminal of FIG. 37a are combined.

FIGS. 37a and 37b illustrate a body and a main battery of a mobile terminal (100) according to still another exemplary embodiment of the present invention.

The body (109) illustrated in FIG. 37a may include a strip fastener (SF) for fastening a strip (HS) to be attached to a body of a user, and a display (151) displaying a time. The body (109) of the mobile terminal (100) fastened only with a sub battery as shown in FIG. 37a may be fastened with the strip (HS) to function as a watch phone.

Furthermore, the body (109) may include a audio output module (152) for outputting audio sound (voice), a microphone (122) for receiving audio sound (voice), a touch screen disposed to overlap the display (151), and a controller (180) conducting an audio sound (voice) communication and displaying a time on the display (151). The user may manipulate the touch screen to command audio sound (voice) communication.

Referring to FIG. 37b, the body (109) and the main battery (400) are combined to form a bar-type mobile terminal.

The main battery (400) may include a keypad as a user input unit (130) for transmitting a user's manipulation of keys of the keypad to the body (109) of the mobile terminal.

In order for the user to manipulate the body (109) of the mobile terminal, the user may use the touch screen when the body (109) is separated from the main battery, (400) and the user may use the touch screen and/or the keypad when the body (109) is fastened to the main battery (400).

When the body (109) as a watch phone illustrated in FIG. 37a is fastened to the main battery (400), the mobile terminal may automatically charge a sub battery by using the charged power of the main battery (400). This addresses the difficulty in a watch phone of installing a slot for charging with the main battery (400).

A mobile terminal (100) according to the fifth exemplary embodiment may have the configuration of FIG. 2 to include a body (109), a sub battery (300) and a main battery (400) as first/second batteries for supplying power to the body (109), and a controller ((180)) for searching for a battery that may be fastened to the body (109) instead of (or other than) the sub battery and/or the main battery.

Figure 38A:
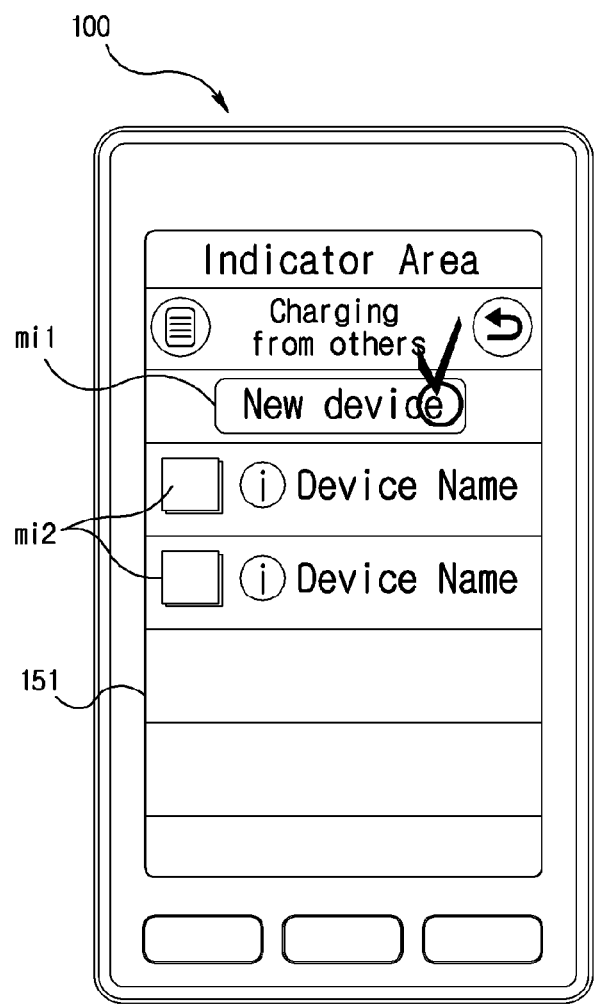
FIGS. 38a and 38b are schematic views illustrating a display screen of a mobile terminal according to still another exemplary embodiment.
Figure 38B:
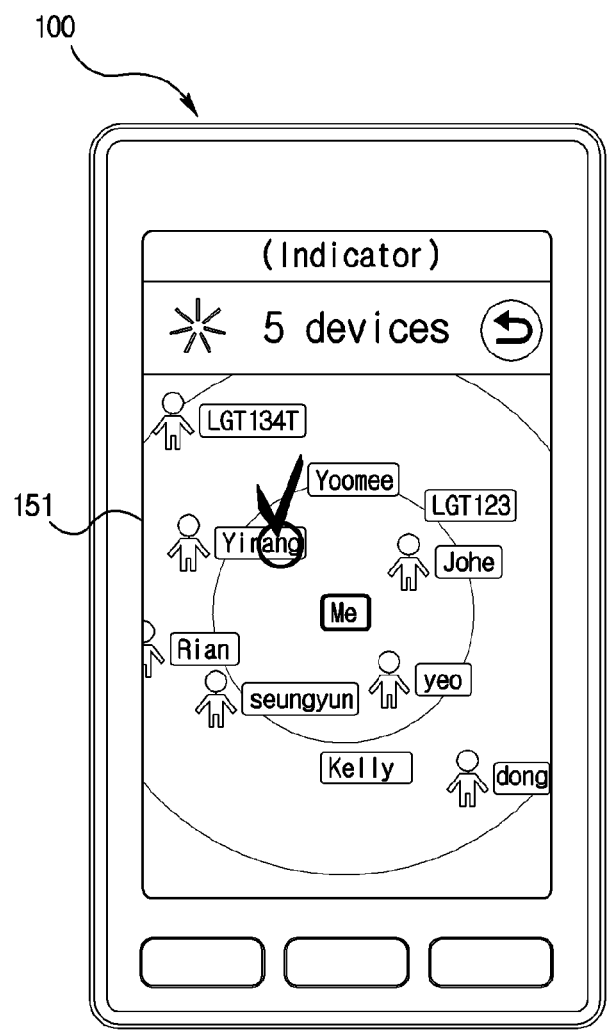

FIGS. 38a and 38b are schematic views illustrating a display screen in which a mobile terminal (100) is in the process of searching for a battery.

When the charged level of a battery is low, the user may manipulate the user input unit ((130) of FIG. 2) to request a search for a piece of peripheral equipment having a standard battery capable of being fastened to the motile terminal (100), and a screen illustrated in FIG. 38a may be displayed.

The device icons (mi2) illustrated in FIG. 38a may represent the devices that have been previously searched by the user at the same location and stored in the mobile terminal (100), and the stored devices may be also displayed.

When the user selects one of the device icons (im2), a device corresponding to the selected icon is re-searched and regardless whether the re-search was successful or not, the charged level of a battery of a relevant device may be displayed.

Referring to FIG. 38a, when the user touches a new device icon (mi1), the mobile terminal (100) may use the short-range communication module (114) (e.g., Bluetooth™ module) to search for a device having a standard battery, and is located within a communicable range of the short-range communication module, which can be fastened (coupled) to the mobile terminal. Devices having the standard battery, and which have been searched as a result of the search, may be displayed as shown in FIG. 38b.

In some exemplary embodiments, the mobile terminal (100) illustrated in FIG. 38b may autonomously search for a piece of peripheral equipment having a standard battery that can be fastened to the mobile terminal, without the user's command and, when the charged level of the main battery (400) of the mobile terminal is low, display a searched result.

Then, the user may separate the body (109) from the main battery 400, and then detach a battery from one of the searched equipment and fasten the battery to the body of the mobile terminal (100).

FIGS. 39a to 39e are schematic views illustrating a display screen of a mobile terminal (100) according to still another exemplary embodiment, in which a process is displayed on the display screen where the mobile terminal searches for a piece of peripheral equipment capable of performing a wireless battery charging and the charging is performed.

Figure 39A:
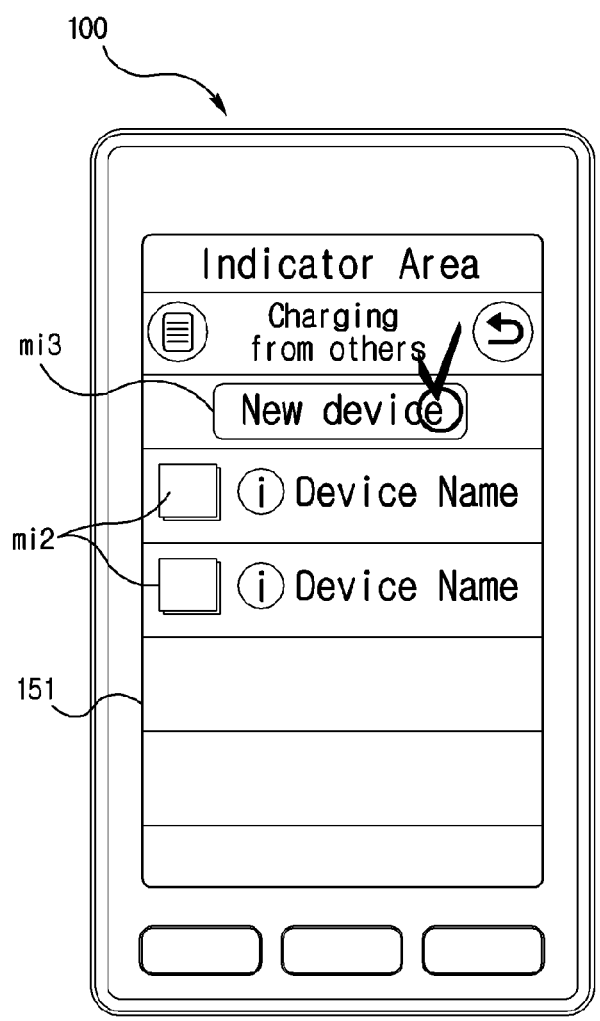
FIGS. 39a to 39e are schematic views illustrating a display screen of a mobile terminal according to still another exemplary embodiment.

When the charged level is low, and the user manipulates the user input unit (130) to instruct a wireless power transmission, a process of which may be displayed on a screen as shown in FIG. 39a.

The device icons (mi1) shown in FIG. 39a may represent the devices that have been previously searched by the user at the same location and stored in the mobile terminal (100), and the stored devices may be also displayed.

Figure 39B:
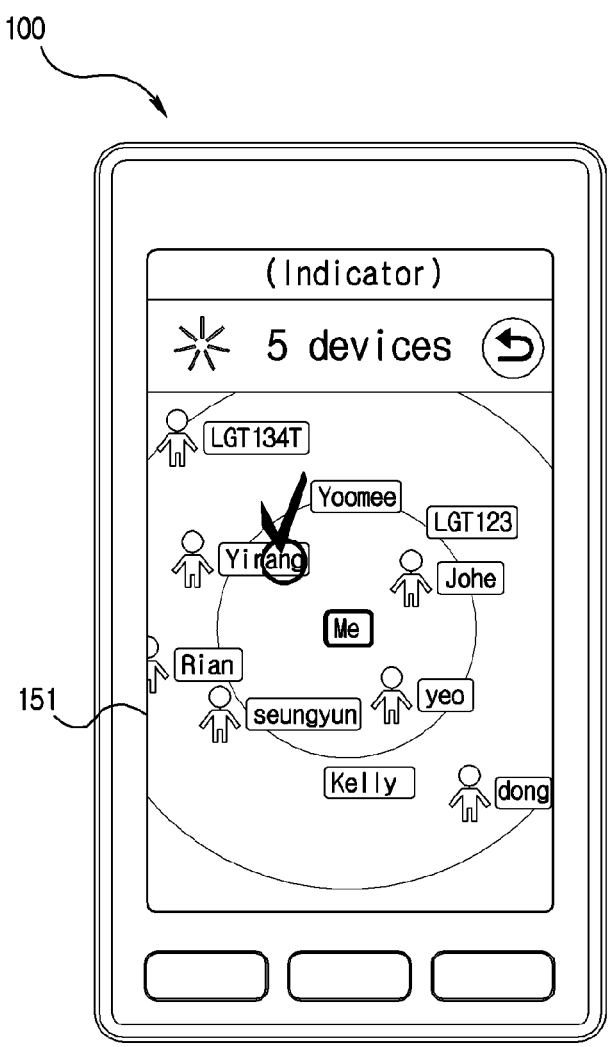
Figure 39C:
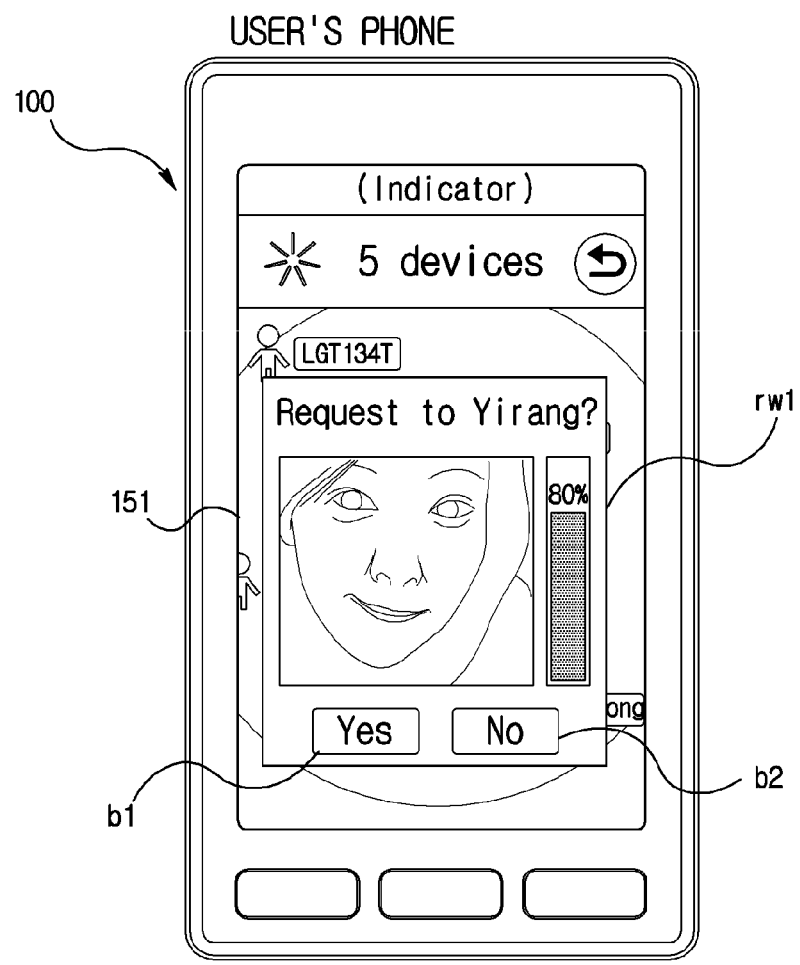
Figure 39D:
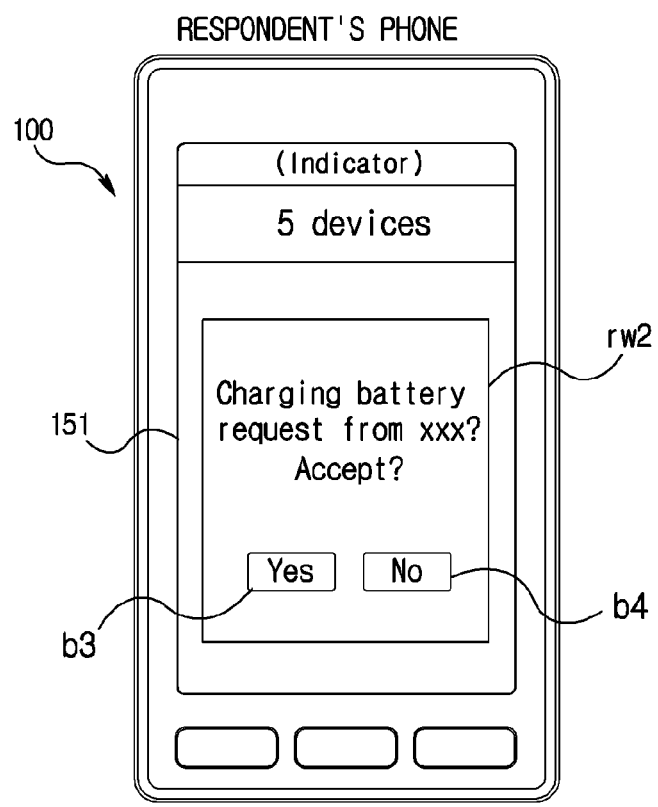
Figure 39E:
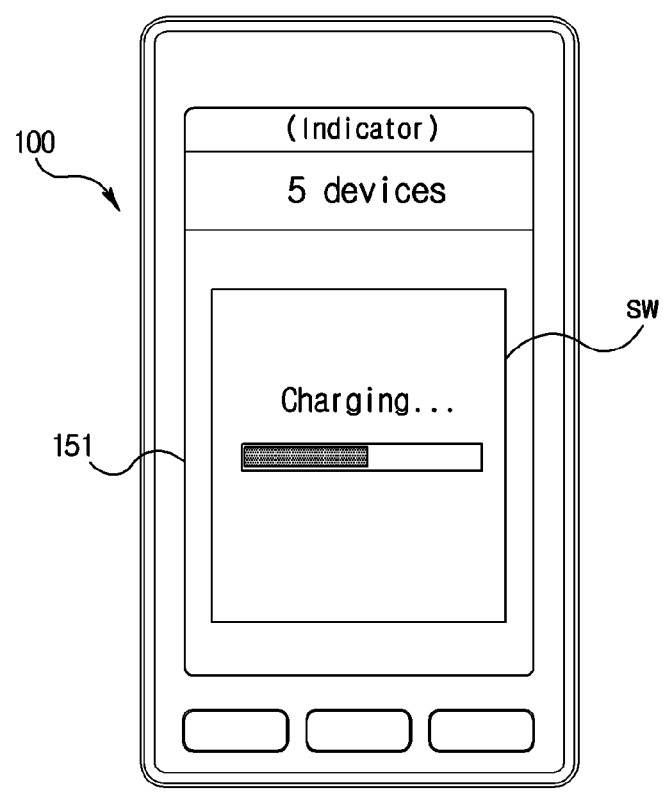

When the user selects one of the device icons (im2), a process of FIG. 39c or FIG. 39e may be performed for receiving a wireless power transmission from a device corresponding to the selected icon.

When the user touches a new device icon (mi3) on the screen of FIG. 39a, the mobile terminal (100) may use the short-range communication module (114) (e.g., Bluetooth™ module) to search for a device located within a communicable range of the short-range communication module, which can perform the wireless power transmission. The devices found as a result of the search and capable of performing the wireless power transmission may be displayed as shown in FIG. 39b.

When the user selects one of the devices in FIG. 39b, a user of the selected device is displayed as shown in FIG. 39c and a window (rw1) inquiring whether to request a wireless power transmission is displayed. The window (rw1) may also display the battery charged level of the selected battery.

If the user selects a YES button (b1) on the inquiry window (rw1), a wireless power transmission request window (rw2) illustrated in FIG. 39d may be displayed on a display (151) of the device selected by the user.

If the user of the selected device selects a YES button (b3) on the wireless power transmission request window (rw2), a wireless power transmission displayed in FIG. 39e may be conducted. The screen of FIG. 39e showing the wireless power transmission performance may be displayed on the mobile terminal (100) that has requested the wireless power transmission or on the mobile terminal that has received the request of the wireless power transmission. The mobile terminal may charge the main battery (400) and/or the sub battery (300) using the power received from the wireless power transmission.

Figure 40:
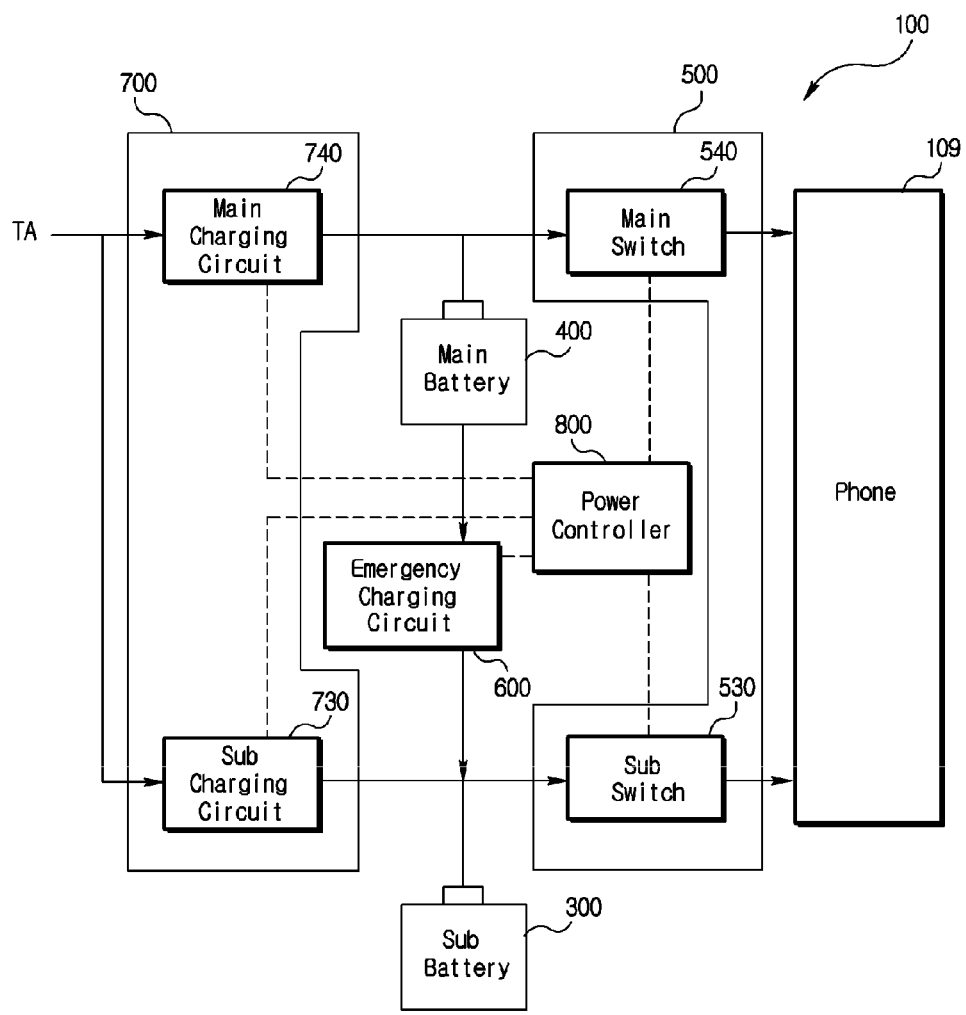
FIG. 40 is a block diagram illustrating a configuration of a mobile terminal according to an exemplary embodiment.

FIG. 40 is a block diagram illustrating a mobile terminal in detailed configuration according to an exemplary embodiment of the present invention.

The mobile terminal (100) illustrated in FIG. 40 according to one exemplary embodiment may include: a main battery (400) as a second battery supplying driving power to the body (109) of the mobile terminal; a sub battery (300) as a second battery supplying a driving power to the mobile terminal if the main battery has difficulty supplying the driving power to the body of the mobile terminal; a power supply unit (500) transmitting the driving power supplied from the first and second batteries (400, 300) to the body of the mobile terminal; an emergency charge circuit (600) charging the sub battery (300) using charged power of the main battery (400); a charger (700) charging the first and second batteries (400, 300) using an external power source; and a power controller (800) activating the emergency charging circuit (600) if the charged level of the main battery (400) is less than a predetermined first reference level but greater than a third reference level, and the charged level of the sub battery (300) is less than a second reference level.

The main battery (400) may be detachable from the body (109), while the sub battery (300) may be embedded in the body (109) of the mobile terminal The power supply unit (500) may include a main switch block (540) transmitting the charged power of the main battery (400) to the body (109), and a sub switch block (530) transmitting the charged power of the sub battery (300) to the body (109) of the mobile terminal.

The charger (700) may include a main charging circuit (740) charging the main battery (400) using a power source supplied from outside, and a sub charging circuit (730) charging the sub battery (300) using the power supplied from outside.

The power controller (800) may activate only one selected circuit out of the main charging circuit (740) and the sub charging circuit (730), or may activate both circuits (740, 730).

The power controller (800) also may turn on only one selected block out of the main switch block (540) and the sub switch block (530), or may turn on both circuits (540, 530).

If the capacity of the sub battery (300) is smaller than the capacity of the main battery (400), and even if the charged level of the main battery is lower than that of the sub battery, a boosted-up voltage from the main battery (400) may provide sufficient power for charging the sub battery (300).

The emergency charging circuit (600) may be provided with a boost-up circuit for boosting up the voltage supplied from the main battery. The boost-up circuit may be, for example, a charge pump.

Figure 41:
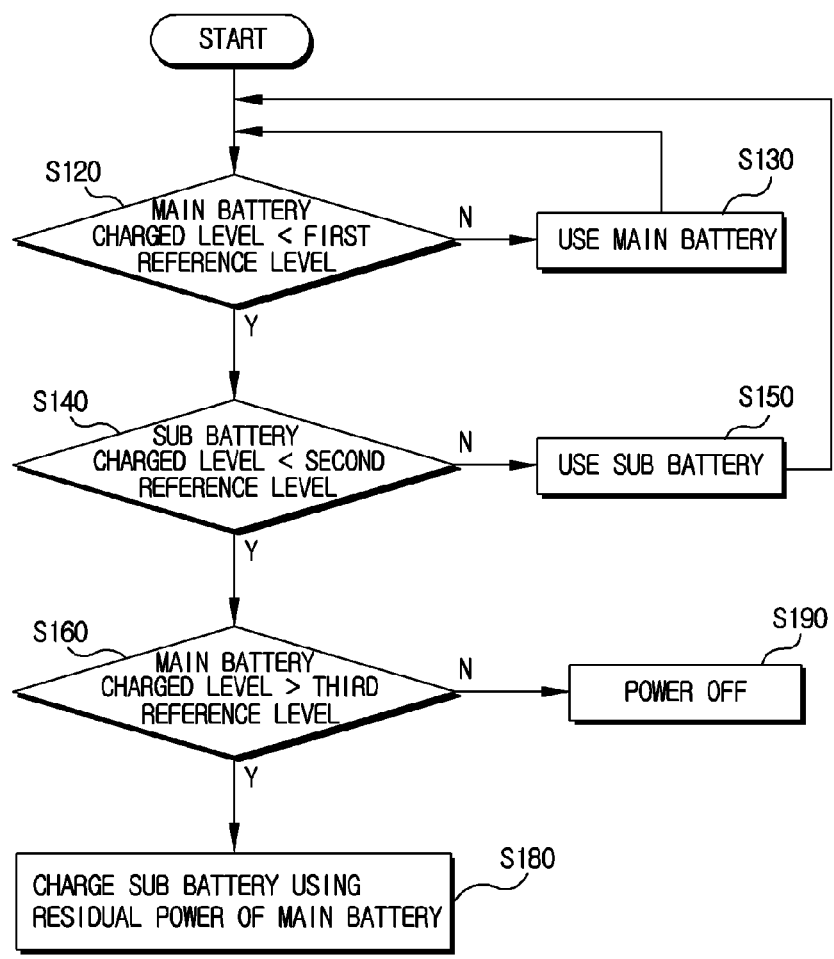
FIG. 41 is a flowchart illustrating an emergency charging method to be performed by the mobile terminal illustrated in FIG. 40.

FIG. 41 is a flowchart illustrating an emergency charging method to be performed by the mobile terminal (100) illustrated in FIG. 40, wherein the mobile terminal including the main battery (400) and sub battery (300) is performing an emergency charging, and where the emergency charging method is conducted by the power controller (800).

The emergency charging method performed by the mobile terminal (100) may include: comparing a charged level of the main battery (400) with a first reference level (S120); comparing the charged level of the sub battery (300) with a second reference level if the charged level of the main battery is lower than the first reference level (S140); comparing the charged level of the main battery with a third reference level if the charged level of the sub battery is lower than the second reference level (S160); and charging the sub battery using residual power of the main battery if the charged level of the main battery is higher than the third reference level (S180).

Charging the sub battery (300) (S180) may include boosting up the voltage of the main battery (400) and charging the sub battery with the boosted-up power.

The first reference level is a level set to prevent the main battery (400) from using the charged quantity at a quantity less than the first reference level. The second reference level (140) is a level set to prevent the sub battery (300) from using the charged quantity at a quantity less than the second reference level, and the third reference level (160) is a level set to prevent the emergency charging from being performed at a quantity less than the third reference level.

If the charged level of the main battery (400) is higher than the first reference level, the main battery supplies a driving power to the mobile terminal (100), and (140) if the charged level of the sub battery (300) is higher than the second reference level, the sub battery supplies a driving power to the mobile terminal.

If the charged level of the main battery is smaller than the third reference level, it is determined that there is no charging power to be supplied to the mobile terminal (100), and the mobile terminal is powered off (S190).

The mobile terminal thus configured according to embodiments described in the present disclosure has an advantageous effect in that a user can easily check an operating state of each of multiple batteries mounted on the mobile terminal The mobile terminal thus configured according to embodiments described in the present disclosure has an advantageous effect in that a user can use the multiple batteries mounted on the mobile terminal.

The mobile terminal thus configured according to embodiments described in the present disclosure has an advantageous effect in that a user who is conducting a call, a multimedia reproduction, or a wireless data service using another battery can proceed as normal even if a charged level of one battery is insufficient.

The mobile terminal thus configured according to embodiments described in the present disclosure has an advantageous effect in that a user who is conducting a call, a multimedia reproduction, or a wireless data service using another battery can proceed as normal even if a charged level of any one battery is insufficient.

The mobile terminal thus configured according to embodiments described in the present disclosure has an advantageous effect in that user convenience can be enhanced by an auxiliary function of a separable battery.

The mobile terminal thus configured according to embodiments described in the present disclosure has an advantageous effect in that an emergency call can be conducted even if charges of all the batteries are insufficient.

Although embodiments have been described with reference to a number of illustrative embodiments, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

For example, although exemplary embodiments have been described with reference to a mobile terminal having two batteries for convenience of explanation, other embodiments may be directed to a mobile terminal having more than three batteries and at least two functions, the implementation of which is also within the scope of the present disclosure.

Furthermore, the indications operations as described with reference to two-battery configurations may also apply to configurations including three or more batteries connected in parallel and are also within the scope of the present disclosure.

For example, although exemplary embodiments have referred to comparison of charged levels of first and second batteries with predetermined reference levels, the comparison of charged levels of the first and second batteries with predetermined reference levels may be accomplished by comparing output voltages of the first and second batteries (e.g., no-load output voltage or loaded output voltage) with predetermined reference levels in view of the fact that the battery charged voltage is determined by the battery charged level.

What is claimed is:

1. A mobile terminal comprising:
   first and second batteries for supplying driving power to the mobile terminal;
   a display unit for displaying content to a user, the content indicating an operational state of the mobile terminal;
   a user input unit for receiving a command from the user; and
   a controller configured to:
      control the display unit to display charged levels of the first and second batteries;
      perform an inter-charging between the first and second batteries upon receiving the command from the user;
      control the display unit to display the charged levels of the first and second batteries using electrode images each having an anode and a cathode; and
      control the display unit to indicate use, charging and status of the first and second batteries using a direction toward which the anode of the respective electrode image protrudes.

2. The mobile terminal of claim 1, wherein the controller is further configured to control the display unit to indicate the charged levels of the first and second batteries using graphical representations of water levels in a vessel, the water levels corresponding to the charged levels of the first and second batteries.

3. The mobile terminal of claim 2, wherein the controller is further configured to perform the inter-charging in response to the water levels in the vessel.

4. The mobile terminal of claim 2, further comprising:
   a motion sensor for detecting a movement of the mobile terminal,
   wherein the controller is further configured to perform the inter-charging in response to a tilting of the mobile terminal detected by the motion sensor.

5. The mobile terminal of claim 3, wherein the controller is further configured to inquire of the user whether a charge-completed battery is to be designated as a main battery, if charging of one of the first and second batteries is completed.

6. The mobile terminal of claim 4, wherein the controller controls the display unit to display the charged levels of the first and second batteries using two battery icons in an indicator area.

7. A method of operating a mobile terminal, the method comprising:
   supplying, by first and second batteries, driving power to the mobile terminal;
   displaying, by a display unit, content to a user, the content indicating an operational state of the mobile terminal;
   receiving, by a user input unit, a command from the user; and
   controlling, by a controller, the display unit to:
      display charged levels of the first and second batteries;
      perform an inter-charging between the first and second batteries upon receiving the command from the user;
      control the display unit to display the charged levels of the first and second batteries using electrode images each having an anode and a cathode; and
      control the display unit to indicate use, charging and status of the first and second batteries using a direction toward which the anode of the respective electrode image protrudes.

* * * * *